(12) United States Patent
Lee et al.

(10) Patent No.: US 8,966,349 B2
(45) Date of Patent: Feb. 24, 2015

(54) DTV TRANSMITTING SYSTEM AND RECEIVING SYSTEM AND METHOD OF PROCESSING BROADCAST SIGNAL

(71) Applicant: LG Electronics Inc., Seoul (KR)

(72) Inventors: Hyoung Gon Lee, Seoul (KR); In Hwan Choi, Gwacheon-si (KR); Kook Yeon Kwak, Anyang-si (KR); Jong Moon Kim, Gwangmyeong-si (KR); Won Gyu Song, Seoul (KR); Byoung Gill Kim, Seoul (KR); Jin Woo Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 14/092,673

(22) Filed: Nov. 27, 2013

(65) Prior Publication Data

US 2014/0189471 A1 Jul. 3, 2014

Related U.S. Application Data

(63) Continuation of application No. 13/244,248, filed on Sep. 23, 2011, now Pat. No. 8,627,185, which is a continuation of application No. 11/741,127, filed on Apr. 27, 2007, now Pat. No. 8,059,723.

(60) Provisional application No. 60/821,249, filed on Aug. 2, 2006.

(30) Foreign Application Priority Data

Apr. 29, 2006 (KR) .................. 10-2006-0039117
Sep. 15, 2006 (KR) .................. 10-2006-0089736

(51) Int. Cl.
*H03M 13/00* (2006.01)
*H04L 1/00* (2006.01)
(Continued)

(52) U.S. Cl.
CPC ............ *H04L 1/0041* (2013.01); *H04L 1/0045* (2013.01); *H04L 1/0065* (2013.01);
(Continued)

(58) Field of Classification Search
CPC ... H04L 1/0041; H04L 1/0045; H04L 1/0057; H04L 1/0059; H04L 1/0071; H04N 21/23424; H04N 21/235; H04N 21/236; H04N 21/55016; H03M 13/2936
USPC .......................................... 714/776; 375/240
See application file for complete search history.

(56) References Cited

U.S. PATENT DOCUMENTS 5,867,503 A 2/1999 Ohsuga
6,118,498 A 9/2000 Reitmeier
(Continued)

FOREIGN PATENT DOCUMENTS

EP 1061746 12/2000
KR 2001-0055543 7/2001
(Continued)

*Primary Examiner* — Sam Rizk
(74) *Attorney, Agent, or Firm* — Birch, Stewart, Kolasch & Birch, LLP

(57) ABSTRACT

A television transmitting system includes an encoder, a data randomizing and expanding unit, a group formatter, a deinterleaver, and a packet formatter. The encoder codes enhanced data for error correction, permutes the coded data, and further codes the permuted data for error detection. The randomizing and expanding unit randomizes the error-detection-coded data and expands the randomized data. The group formatter forms a group of enhanced data having one or more data regions and inserts the expanded enhanced data into at least one of the regions. The deinterleaver deinterleaves the group of enhanced data, and the packet formatter generates enhanced data packets.

22 Claims, 14 Drawing Sheets

(51) Int. Cl.

| | | |
|---|---|---|
| H04N 21/234 | (2011.01) | |
| H04N 21/235 | (2011.01) | |
| H04N 21/236 | (2011.01) | |
| H04N 21/2381 | (2011.01) | |
| H04N 21/2383 | (2011.01) | |
| H04N 21/24 | (2011.01) | |
| H04N 21/435 | (2011.01) | |
| H04N 21/438 | (2011.01) | |
| H04N 21/44 | (2011.01) | |
| H04N 21/4425 | (2011.01) | |
| H03M 13/29 | (2006.01) | |
| H04L 25/03 | (2006.01) | |

(52) U.S. Cl.
CPC ........ *H04L1/0071* (2013.01); *H04N 21/23424* (2013.01); *H04N 21/235* (2013.01); *H04N 21/2353* (2013.01); *H04N 21/236* (2013.01); *H04N 21/2381* (2013.01); *H04N 21/2383* (2013.01); *H04N 21/2404* (2013.01); *H04N 21/435* (2013.01); *H04N 21/4382* (2013.01); *H04N 21/4384* (2013.01); *H04N 21/44016* (2013.01); *H04N 21/4425* (2013.01); *H03M 13/2936* (2013.01); *H04L 1/0057* (2013.01); *H04L 1/0059* (2013.01); *H04L 1/0061* (2013.01); *H04L 25/03178* (2013.01)
USPC ............................................ 714/776; 375/240

(56) References Cited

U.S. PATENT DOCUMENTS

| | | | |
|---|---|---|---|
| 8,020,066 | B2 | 9/2011 | Lee et al. |
| 2002/0154709 | A1 | 10/2002 | Choi et al. |
| 2003/0099303 | A1* | 5/2003 | Birru et al. .................... 375/265 |
| 2004/0184399 | A1 | 9/2004 | Chiou |
| 2005/0097428 | A1 | 5/2005 | Chang |
| 2005/0249301 | A1* | 11/2005 | Jeong et al. .................... 375/265 |
| 2006/0245505 | A1 | 11/2006 | Limberg |

FOREIGN PATENT DOCUMENTS

| | | |
|---|---|---|
| KR | 10-0734351 | 7/2007 |
| KR | 10-0896684 | 5/2009 |
| KR | 10-1058038 | 8/2011 |
| WO | 2005-006759 | 1/2005 |
| WO | 2005-115001 | 12/2005 |

* cited by examiner (a)

(b)

(c)

DTV TRANSMITTING SYSTEM AND RECEIVING SYSTEM AND METHOD OF PROCESSING BROADCAST SIGNAL

CROSS-REFERENCE TO RELATED APPLICATIONS

This application is a continuation of U.S. patent application Ser. No. 13/244,248, filed on Sep. 23, 2011, currently pending, which is a continuation of U.S. patent application Ser. No. 11/741,127, filed on Apr. 27, 2007, now U.S. Pat. No. 8,059,723, which claims the benefit of earlier filing date and right of priority to Korean Patent Application Nos. 10-2006-0039117, filed on Apr. 29, 2006, and 10-2006-0089736, filed on Sep. 15, 2006, and also claims the benefit of U.S. Provisional Application No. 60/821,249, filed on Aug. 2, 2006, the contents of which are hereby incorporated by reference herein in their entirety.

BACKGROUND OF THE INVENTION

1. Field of the Invention

The present invention relates to television systems and methods of processing a broadcast signal.

2. Discussion of the Related Art

Presently, the technology for processing digital signals is being developed at a vast rate, and, as a larger number of the population uses the Internet, digital electric appliances, computers, and the Internet are being integrated. Therefore, in order to meet with the various requirements of the users, a system that can transmit diverse supplemental information in addition to video/audio data through a digital television channel needs to be developed.

Some users may assume that supplemental data broadcasting would be applied by using a PC card or a portable device having a simple in-door antenna attached thereto. However, when used indoors, the intensity of the signals may decrease due to a blockage caused by the walls or disturbance caused by approaching or proximate mobile objects. Accordingly, the quality of the received digital signals may be deteriorated due to a ghost effect and noise caused by reflected waves. However, unlike the general video/audio data, when transmitting the supplemental data, the data that is to be transmitted should have a low error ratio. More specifically, in case of the video/audio data, errors that are not perceived or acknowledged through the eyes or ears of the user can be ignored, since they do not cause any or much trouble. Conversely, in case of the supplemental data (e.g., program execution file, stock information, etc.), an error even in a single bit may cause a serious problem. Therefore, a system highly resistant to ghost effects and noise is required to be developed.

The supplemental data are generally transmitted by a time-division method through the same channel as the video/audio data. However, with the advent of digital broadcasting, digital television receiving systems that receive only video/audio data are already supplied to the market. Therefore, the supplemental data that are transmitted through the same channel as the video/audio data should not influence the conventional receiving systems that are provided in the market. In other words, this may be defined as the compatibility of broadcast system, and the supplemental data broadcast system should be compatible with the broadcast system. Herein, the supplemental data may also be referred to as enhanced data. Furthermore, in a poor channel environment, the receiving performance of the conventional receiving system may be deteriorated. More specifically, resistance to changes in channels and noise is more highly required when using portable and/or mobile receiving systems.

SUMMARY OF THE INVENTION

Accordingly, the present invention is directed to a DTV transmitting system and a DTV receiving system and a method of processing a broadcast signal that substantially obviate one or more problems due to limitations and disadvantages of the related art.

The present invention is to provide a DTV transmitting system and a DTV receiving system and a method of processing a broadcast signal that is suitable for transmitting supplemental data and that is highly resistant to noise.

The present invention is to provide a DTV transmitting system and a DTV receiving system and a method of processing a broadcast signal, which are capable of performing additional encoding for enhanced data and transmitting it, thereby enhancing receiving performance of a receiving system.

The present invention is to provide a DTV transmitting system and a DTV receiving system and a method of processing a broadcast signal, which capable of multiplexing known data that are already known by a receiving system and/or a transmitting system and enhanced data, and main data, and transmitting it, thereby enhancing the receiving performance of the receiving system.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a digital television (DTV) transmitting system includes an encoder, a data randomizing and expanding unit, a group formatter, a deinterleaver, and a packet formatter. The encoder codes enhanced data for error correction, permutes the enhanced data coded for error correction, and codes the permuted enhanced data for error detection. The data randomizing and expanding unit randomizes the enhanced data coded for error detection and expands the randomized data at an expansion rate of 1/H. The group formatter forms a group of enhanced data having one or more data regions and inserts the expanded enhanced data into at least one of the data regions. The packet formatter generates enhanced data packets including the deinterleaved enhanced data.

In another aspect of the present invention, a DTV receiving system includes a tuner, a demodulator, an equalizer, a block processor, a data deformatter, and a frame decoder. The tuner tunes to a channel to receive a digital broadcast signal including main and enhanced data. The demodulator demodulates the received broadcast signal, and the equalizer compensates channel distortion of the demodulated signal. The block decoder decodes each block of enhanced data in the channel-equalized signal. The data deformatter deformats the decoded enhanced data, removes null data included in the deformatted enhanced data, and derandomizes the null-data-removed enhanced data. The frame decoder decodes the derandomized enhanced data for error detection, permutes the enhanced data decoded for error detection, and decodes the permuted enhanced data for error correction.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts. In addition, although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meaning of each term lying within.

In the present invention, the enhanced data may either consist of data including information such as program execution files, stock information, and so on, or consist of video/audio data. Additionally, the known data refer to data already known based upon a pre-determined agreement between the transmitting system and the receiving system. Furthermore, the main data consist of data that can be received from the conventional receiving system, wherein the main data include video/audio data. The present invention relates to performing additional encoding on the enhanced data so as to provide robustness to the encoded data, thereby enabling the data to take strong countermeasures against the constantly changing channel environment. As an embodiment of the present invention, at least any one of the error correction encoding and the error detection encoding is performed on the enhanced data. Furthermore, a process of mixing (or permuting) several sets of the encoded data to a predetermined size may also be included.

Figure 1:
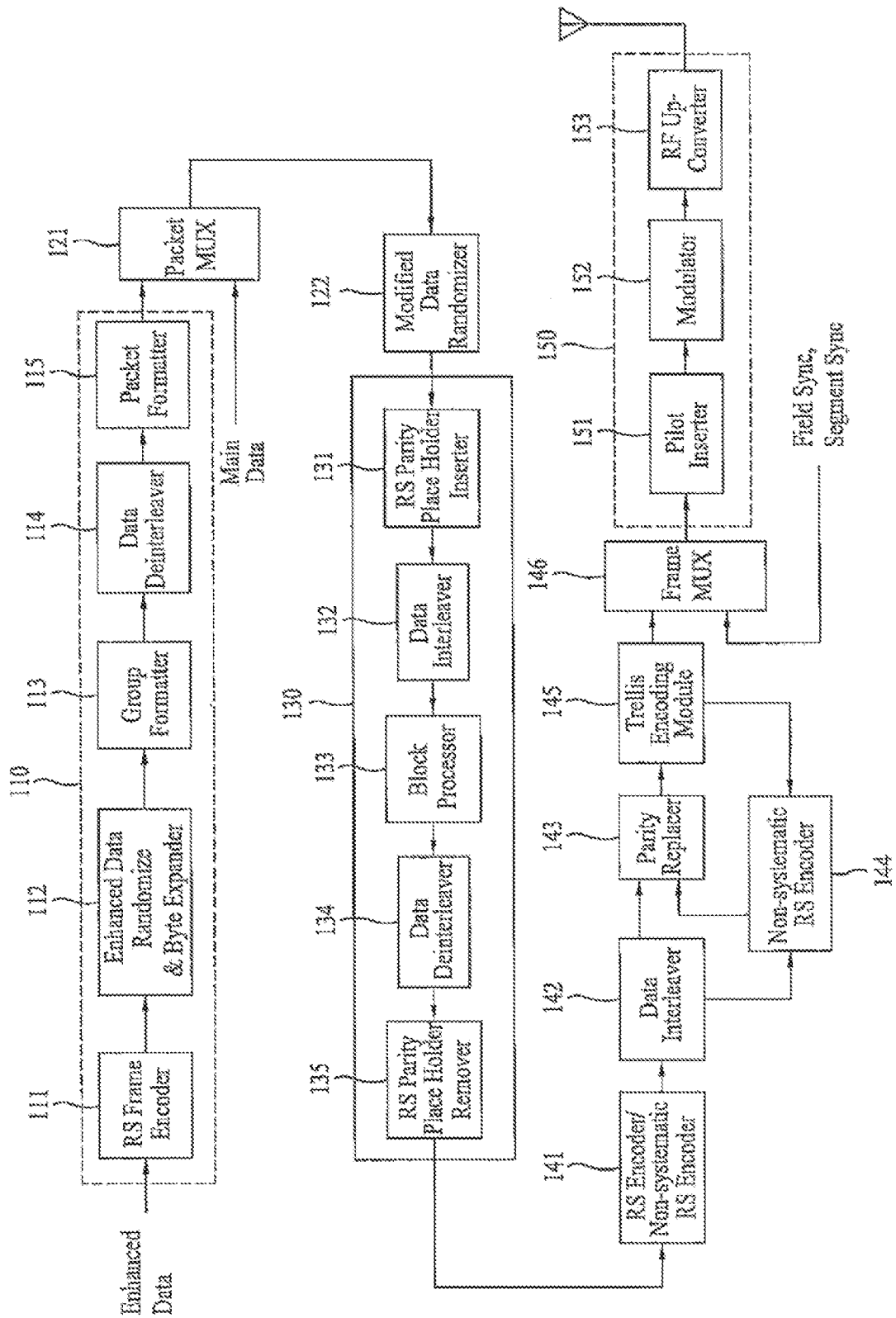
FIG. 1 illustrates a block diagram showing a structure of a digital broadcast transmitting system according to an embodiment of the present invention.

FIG. 1 illustrates a block diagram showing a structure of a digital broadcast transmitting system according to an embodiment of the present invention. Referring to FIG. 1, the digital broadcast transmitting system includes a pre-processor 110, a packet multiplexer 121, a data randomizer 122, a post-processor 130, an RS encoder/non-systematic RS encoder 141, a data interleaver 142, a parity replacer 143, a non-systematic RS encoder 144, a trellis encoding module 145, a frame multiplexer 146, and a transmitting unit 150. The pre-processor 110 includes a RS frame encoder 111, a randomizer/byte expander 112, a group formatter 113, a data deinterleaver 114, and a packet formatter 115. The post-processor 130 includes a RS parity place holder inserter 131, a data interleaver 132, a block processor 133, a data deinterleaver 134, and a RS parity place holder remover 135. Finally, the transmitting unit 150 includes a pilot inserter 151, a modulator 152, and a RF up-converter 153.

In the present invention having the above-described structure, the main data is inputted to the packet multiplexer 121, and the enhanced data is inputted to the pre-processor 110 which performs additional encoding, so that the enhanced data can take strong countermeasures against noise and the constantly changing channel environment. The RS frame encoder 111 of the pre-processor 110 receives the enhanced data and configures the frame in order to perform the additional encoding. Thereafter, the pre-processor 110 performs the additional encoding on the enhanced data and, then, outputs the additionally encoded enhanced data to the randomizer/byte expander 112.

The operation of the RS frame encoder 111 will now be described in detail. According to an embodiment of the present invention, the RS frame encoder 111 performs at least any one of an error correction encoding process and an error detection encoding process on the inputted enhanced data so as to provide the data with robustness. In addition, the RS frame encoder 111 may also perform a process of permuting various sets of enhanced data having a predetermined size by dispersing burst errors that may occur due to a change in the frequency environment, thereby enabling the enhanced data to take countermeasures against a severely poor and constantly and abruptly changing frequency environment.

According to another environment of the present invention, the RS frame encoder 111 performs error correction encoding on the inputted enhanced data, so as to add data required for error correction. Then, the RS frame encoder 111 performs a row permutation process for permuting data row by row. Subsequently, the RS frame encoder 111 performs the error detection encoding, thereby adding data required for error detection. At this point, as an example of the present invention, RS-coding is applied for the error correction encoding process, and a cyclic redundancy check (CRC) encoding is applied for the error detection process. When performing the RS-coding, parity data that are used for the error correction are generated. And, when performing the CRC encoding, CRC data that are used for the error detection are generated.

Figure 2:
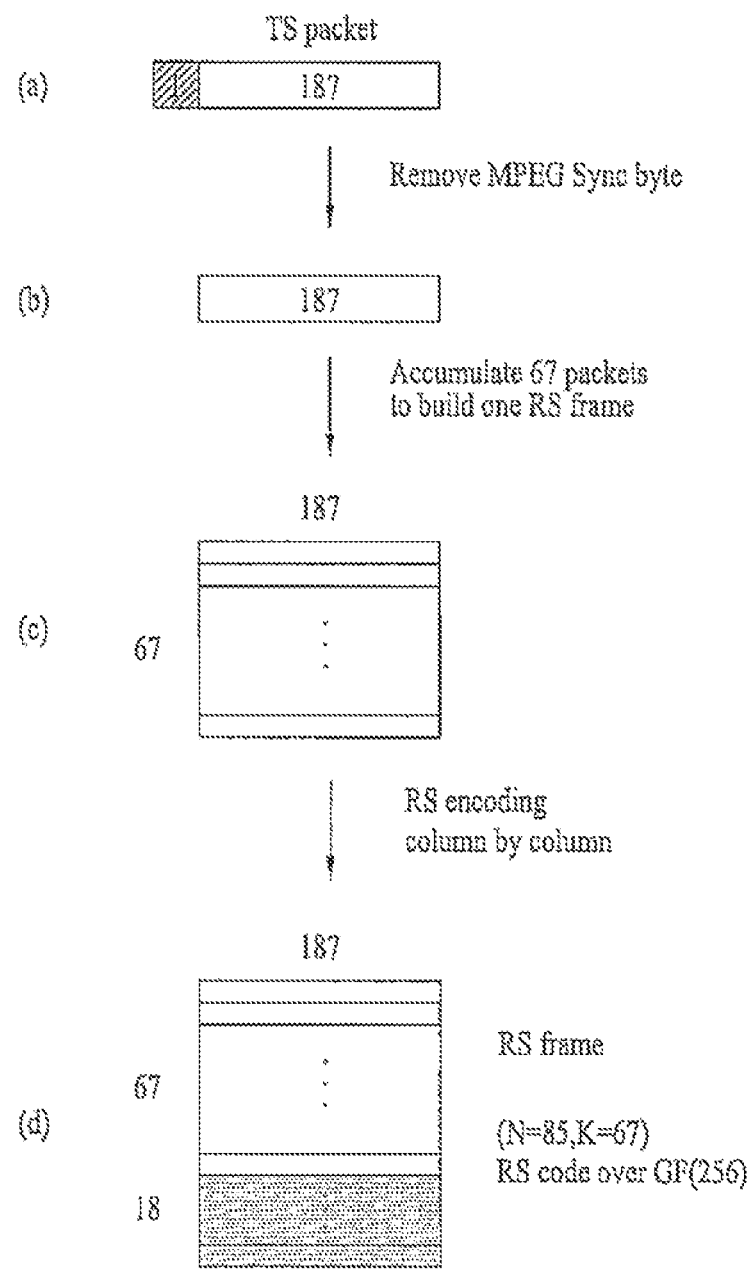
FIG. 2(a) to FIG. 2(d) illustrate process steps of error correction encoding according to an embodiment of the present invention.

FIG. 2 illustrates process steps of error correction encoding according to an embodiment of the present invention. Herein, the inputted enhanced data are identified by units of a predetermined length (A). A plurality of units of the identified predetermined length (A) is grouped to form a frame. Thereafter, RS-coding is performed on the newly formed frame along the direction of the row or column. In the present invention, the predetermined length (A) will be referred to as a row for simplicity of the description. Herein, the value A is decided by the system designer.

For example, if the inputted enhanced data correspond to an MPEG transport stream (TS) packet configured in 188-byte units, the first MPEG synchronization byte is removed as shown in FIG. 2(a). Thereafter, a row (A) is formed on the 187 bytes as shown in FIG. 2(b). Herein, the MPEG synchronization byte is removed so that all enhanced data packets are given the same value. If the inputted enhanced data do not include a removable byte, or if the inputted enhanced data packet is not 187-byte long, the inputted data are divided into units of 187 bytes, so that each 187-byte data unit configures a row (A). When a row (A) is decided according to the above-described process, a plurality of rows (A) is grouped to form a RS frame. In the present invention, a method of grouping 67 rows (A) to form a RS frame, as shown in FIG. 2(c), will be given as an example.

Subsequently, a (N,K)-RS-coding is performed on each column of the RS frame, so as to generate N-K number of parity bytes. Thereafter, the newly created parity bytes are added to the end portion of the corresponding column (i.e., the row following the 67$^{th}$ row of the corresponding column). According to the embodiment of the present invention, N is equal to '85', and K is equal to '67'. Accordingly, the size of the parity data that are added to each column, as shown in FIG. 2(d), is equal to 18 bytes. When performing the (85,67)-RS-coding process on all 187 columns within the RS frame, a RS frame including one row configured of 187 bytes and a column configured of 85 bytes may be obtained. More specifically, the RS encoded RS frame includes 85 rows each configured of 187 bytes. As described above, the number of bytes, the number of rows configuring the RS frame, and the N and K values used in the RS-coding process may vary depending upon the design of the system or any other circumstances and are not limited to the above-described example.

Figure 3:
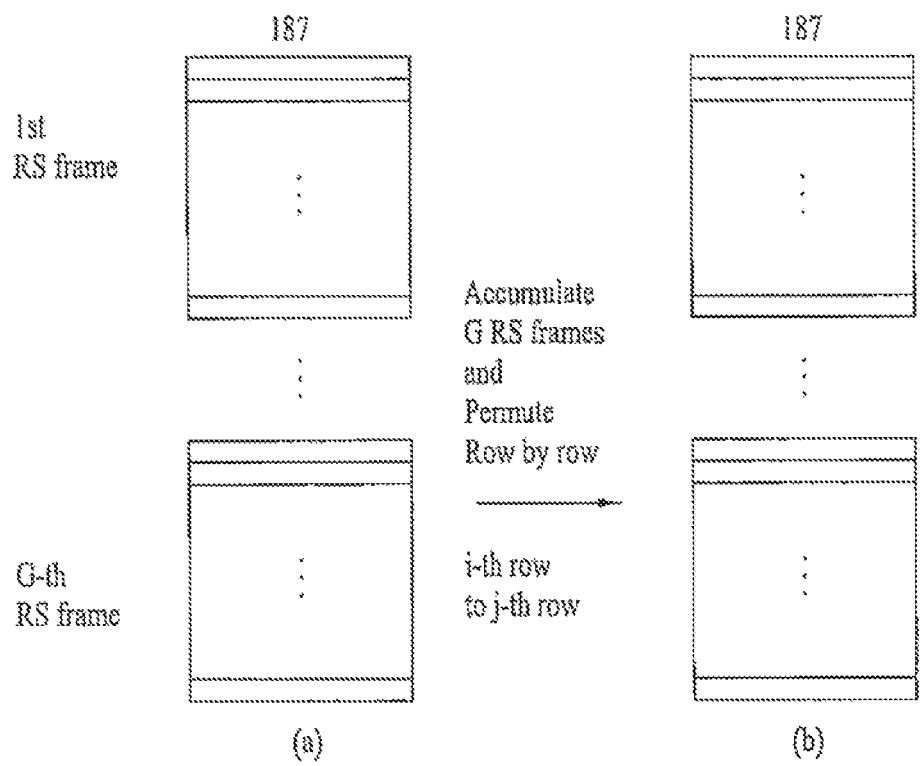
FIG. 3(a) and FIG. 3(b) illustrate process steps of row permutation according to an embodiment of the present invent ion

FIG. 3 illustrates process steps of row permutation according to an embodiment of the present invention. Herein, FIG. 3 shows an example of a row permutation process performed on the RS encoded data. More specifically, a plurality (or G number) of RS frames that are RS encoded are grouped to form a group. Thereafter, the row permutation process is performed in group units. If it is assumed that one row is equal to 187 bytes, and (85,67)-RS-coding is performed in FIG. 2, G number of RS frames configured of 85 rows, as shown in FIG. 3 (a), is grouped to form a RS frame group consisting of 85*G number of 187-byte rows. When the row permutation is performed on the above-configured RS frame group by using a predetermined method, the position of each row prior to the row permutation is different from the position of each row after performing the row permutation. In other words, after performing the row permutation process, the i$^{th}$ row of the RS frame group prior to the row permutation process, shown in FIG. 3(a), is placed to the j$^{th}$ row of the RS frame group after the row permutation process, as shown in FIG. 3 (b). The relation between i and j is shown in Equation 1 below.

$$j=G(i \bmod S)+\lfloor i/S \rfloor$$

$$i=S(j \bmod G)+\lfloor j/G \rfloor \qquad \text{[Equation 1]}$$

where $0 \leq i, j < SG$

Each row of the RS frame group consists of 187 bytes even after the row permutation process is performed. At this point, the sizes of the RS frame prior to and after the row permutation process do not necessarily have to be identical to one another. However, the total number of rows within the RS frame groups both prior to and after the row permutation should be identical to one another. For example if the number of RS frames configuring the RS frame group prior to the row permutation process is C, and if it is assumed that the number of rows within one RS frame is 84, then there is no problem in the row permutation operation even, if the number of RS frames configuring the RS frame group after the row permutation process is 2G, and if the number of rows within one RS frame is 42. In other words, the sizes of each RS frame both prior to and after the row permutation process may be decided arbitrarily by the system designer, FIG. 4(a) to FIG. 4(c) illustrate process steps of the CRC encoding process according to an embodiment of the present invention. Herein, FIG. 4(a) to FIG. 4(c) correspond to examples of performing the CRC encoding process on the data in which the row permutation process is performed. The CRC data generated by the CRC encoding process are used for indicating whether damage has occurred due to an error in the enhanced data while being transmitted through a channel. The present invention may also use other error detection encoding methods other than the CRC encoding method. Alternatively, by using the error correction encoding method, the overall error correction ability of the receiving system may be enhanced.

Referring to FIG. 4(a) to FIG. 4(c), the example off the process steps of the error detection encoding method according to the present invention will now be described in detail. FIG. 4(a) illustrates an example of an S-bit CRC checksum being used as the CRC data. More specifically, a 1-byte (i.e., 8-bit) CRC checksum is generated for the 187 bytes of each row. Then, the CRC checksum is added to the corresponding row. Equation 2 below shows the example of a polynominal equation for generating the 1-byte CRC checksum for the 187 bytes.

$$g(x)=x^8+x^2+x^1+1 \qquad \text{[Equation 2]}$$

Figure 4:
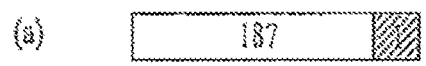
FIG. 4(a) to FIG. 4(c) illustrate process steps of error detection encoding according to an embodiment of the present invention.
Figure 4:
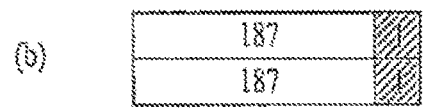
Figure 4:
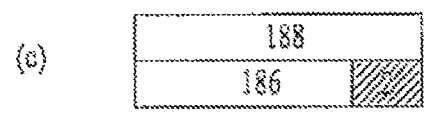

At this point, the 1-byte CRC checksum may be added to any position (or place) within the corresponding row. Furthermore, as an embodiment of the present invention, FIG. 4 (a) illustrates an example of the 1-byte CRC checksum being added to the end of the row, thereby configuring a 188-byte row. FIG. 4(b) and FIG. 4(c) illustrate examples of a 16-bit CRC checksum being used as the CRC data. More specifically, a 2-byte (i.e. 16-bit) CRC checksum is generated for each two rows. Then, the CRC checksum is added to the corresponding row(s). Equation 3 below shows the example of a polynominal equation for generating the 2-byte CRC checksum for each two rows (i.e., 374 bytes).

$$g(x)=x^{16}+x^{12}+x^5+1 \qquad \text{[Equation 3]}$$

At this point, the 2-byte CRC checksum may be added to any position (or place) within the corresponding two rows. The 2-byte CRC checksum may be added to a predetermined position within the two corresponding rows, thereby dividing 376 bytes into two separate rows. More specifically. FIG. 4(b) illustrates an example of a 1-byte CRC checksum being added to the end of each row, thereby configuring two 188-byte rows. And, FIG. 4(c) illustrates an example of a 2-byte CRC checksum being added to the end of the second row, thereby configuring two 188-byte rows.

As described above, the CRC encoded data are outputted to the randomizer/byte expander 112. Herein, the randomizer/byte expander 112 receives and randomizes the enhanced data in which robustness has been enhanced due to the encoding and row permutation. Thereafter, byte expansion is performed on the randomized data through the null data insertion process and the repetition process. At this point, by randomizing the enhanced data in the randomizer/byte expander 112, the process of randomizing the enhanced data at the randomizer 122 in a later process may be omitted. The randomizer identical to that of the conventional ATSC or other types of randomizer may be used for randomizing the enhanced data. More specifically, a pseudo random byte generated from within the inputted 187-byte enhanced data may be used to randomize the enhanced data.

Additionally, the order of the randomizing process and the byte expansion process may be altered. In other words, the randomizing process may first be performed as described above, which is then followed by the byte expansion process. Alternatively, the byte expansion process may first be performed, which is then followed by the randomizing process. The order of the processes may be selected in accordance with the overall structure of the system.

The byte expansion process may vary depending upon the coding rate of the block processor 133 of the post-processor 130. More specifically, if the coding rate corresponds to a G/H coding rate, then G bytes are expanded to M bytes. For example, if the coding rate corresponds to 1/2 coding rate, then 1 byte is expanded to 2 bytes. And, if the coding rate is 1/4, then byte is expanded to 4 bytes. Therefore, if the coding rate is 1/2, then the RS encoded 85 188-byte units are expanded to 150 188-byte units.

The enhanced data outputted from the randomizer/byte expander 112 is inputted to the group formatter 113. The group formatter 113 creates a data group in accordance with a pre-defined rule. Thereafter, the group formatter 113 inserts the inputted enhanced data to the corresponding areas within the created data group. At this point, the data group may be described as at least one layered area. Herein, the type of enhanced data allocated to each area may vary depending up on the characteristics of each layered area.

Figure 5:
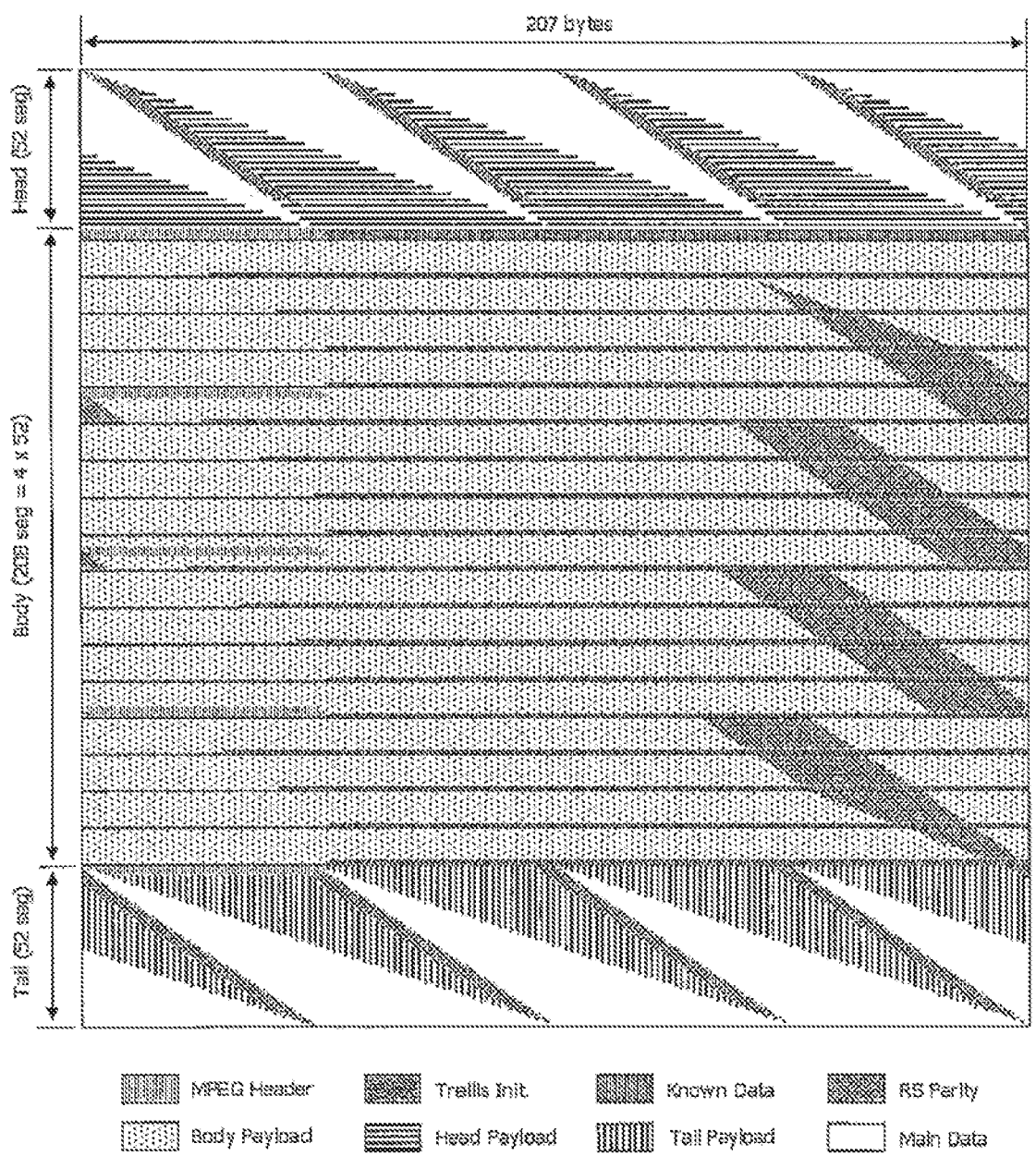
FIG. 5 and FIG. 6 illustrate an examples of data configuration at before and after ends of a data deinterleaver in a digital broadcast receiving system according to the present invention.
Figure 6:
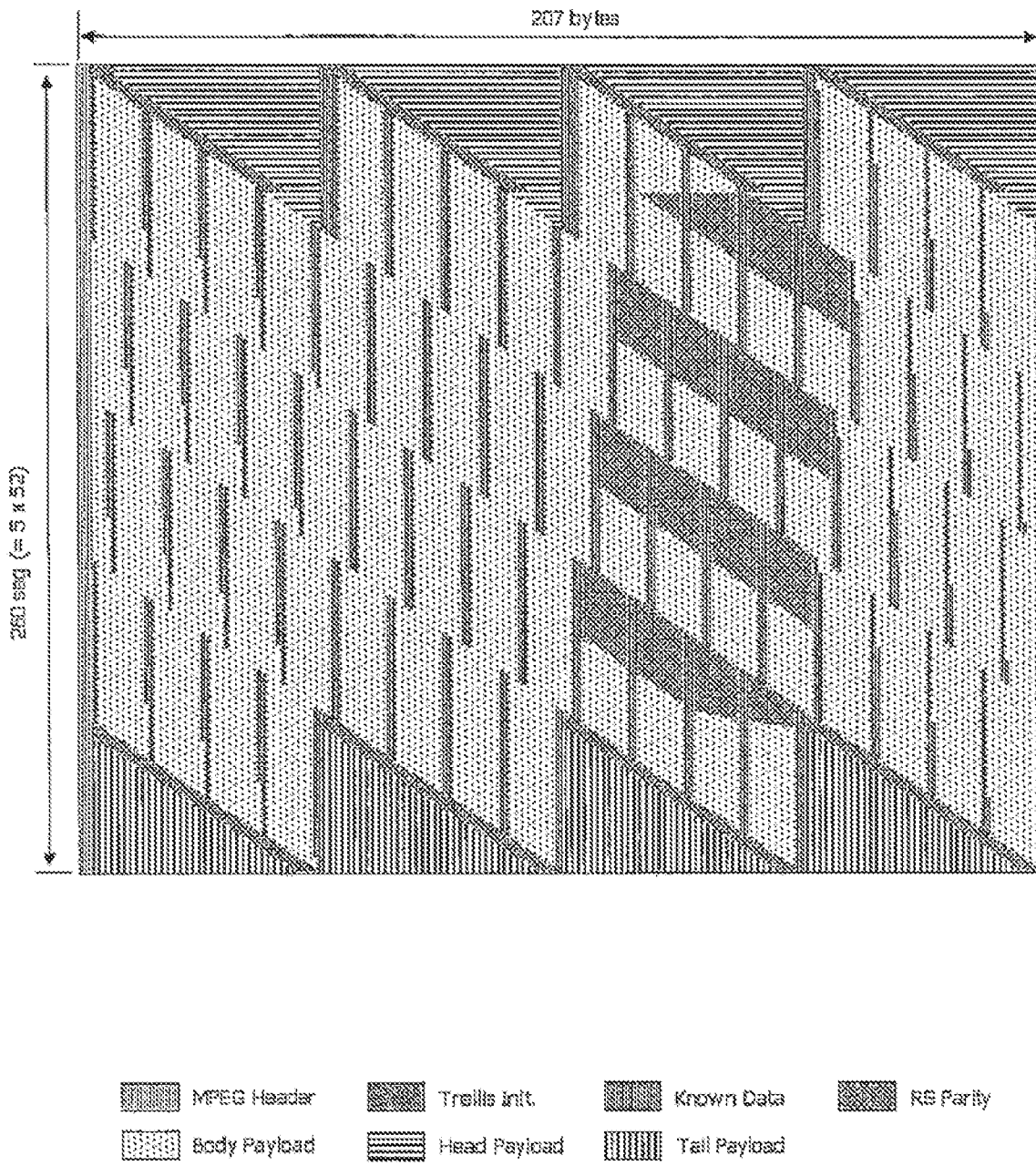

FIG. 5 illustrates an alignment of different data sets prior to the data deinterleaving, and FIG. 6 illustrates an alignment of different data sets after the data deinterleaving. In other words, FIG. 5 corresponds to the data structure after being data interleaved, and FIG. 6 corresponds to the data structure before being data interleaved. FIG. 5 illustrates an example of a data group within a data structure prior to the data deinterleaving, the data group being divided into three layered areas: a head area, a body area, and a tail area. Accordingly, in the data group that is data interleaved and outputted, the head area is first outputted, then the body area is outputted, and the tail area is outputted last.

FIG. 5 and FIG. 6 each shows an example of 260 packets configuring the data group. Herein, since the data interleaver operates periodically in units of 52 packets, a 52*5n number of packets (wherein, n is an integer) configure the data group. In addition, referring to the data group being inputted to the data deinterleaver, as shown in FIG. 5, the body area is configured of a rectangular shape. Accordingly, FIG. 5 illustrates an example of the head, body, and tail areas of the data group being configured so that the body area is entirely formed of the enhanced data and is not mixed with the main data. At this point, the body area of the data group being inputted to the data deinterleaver may be allocated so that the body area includes either at least a portion or the entire portion of an area within the data group having the enhanced data continuously outputted therefrom. Herein, the body area may also include an area having the enhanced data outputted non-continuously.

The data group is divided into three areas so that each area may be used differently. More specifically, referring to FIGS. 5 and 6, the area corresponding to the body is configured only of enhanced data and is not interfered by any main data, thereby showing a highly resistant receiving quality. On the other hand, in each of the areas corresponding to the head and the tail, the enhanced data set is alternately mixed with the main data sets due to the output order of the interleaver. Thus, the receiving quality of the head and tail areas is relatively poorer than that of the body area.

Furthermore, when using a system inserting and transmitting the known data to the data group, and when a long and continuous set of known data is to be inserted periodically in the enhanced data, the known data may be inserted in an area in which the enhanced data are not mixed with the main data based upon the output order from the data interleaver. More specifically, in the body area of FIGS. 5 and 6, a predetermined length of known data may be periodically inserted in the body area. However, it is difficult to periodically insert the known data in the head area and the tail area, and it is also difficult to insert a long and continuous set of known data. Therefore, the group formatter 113 inserts the enhanced data inserted in the corresponding area within the above-described data group.

For example, the group formatter 113 allocates the received enhanced data to the body area. And, apart from the enhanced data, the group formatter 113 also separately allocates signaling information indicating the overall transmission information to the body area. In other words, the signaling information corresponds to information required by the receiving system for receiving and processing the data included data group. Herein, the signaling information includes data group information, multiplexing information, and so on. Furthermore, as shown in FIG. 5, the group formatter 113 also inserts an MPEG header place holder, a non-systematic RS parity place holder, and a main data place holder in relation with the data deinterleaving. Referring to FIG. 5, the main data place is allocated because the enhanced data and the main data are alternately mixed in the head and tail areas based upon the input of the data deinterleaver. In the output data that have been data interleaved, the place holder for the MPEG header is allocated to the very beginning of each packet.

The group formatter 113 either inserts the known data generated by a pre-decided method in a corresponding area, or inserts a known data place holder in a corresponding area so as to insert the known data in a later process. Moreover, a place holder for initializing the trellis encoding module 145 is inserted in the corresponding area. For example, the initialization data place holder may be inserted in front of the known data sequence. The data group having either the data or the place holder inserted therein by the group formatter 113 is inputted to the data deinterleaver 114. Referring to FIG. 5, whenever required in a later process, the head and tail areas may be used for the enhanced data or other information data or data used for supporting the enhanced data.

The data deinterleaver 114 performs an inverse process of the data interleaver on the inputted data group and, then, outputs the deinterleaved data group to the packet formatter 115. More specifically, when the data group having the format shown in FIG. 5 is inputted to the data deinterleaver 114, the data group is deinterleaved, as shown in FIG. 6, and outputted to the packet formatter 115. Herein, only the portions corresponding to the data group are shown in FIG. 6. Among the deinterleaved and inputted data, the packet formatter 115 removes the main data place holder and the RS parity place holder that have been allocated for the deinterleaving process and inserts the known data in place of the removed place holders. Alternatively, the known data place holder may be directly outputted without any modification for the replacement insertion in the post-processor 130.

Thereafter, the packet formatter 115 configures the data within the data group packet that is formatted as described above, as a 180-byte unit MPEG TS packet. Then, the packet formatter 115 provides the configured 128-byte unit MPEG TS packet to the packet multiplexer 121. The packet multiplexer 121 multiplexes the 188-byte enhanced data packet and the main data packet outputted from the packet formatter 115 according to a pre-defined multiplexing method. Then, the multiplexed packets are outputted to the data randomizer 122. The packet multiplexer 121 will be described in more detail in a later process. When the inputted data correspond to the main data packet, the data randomizer 122 performs a randomizing process identical to that of the conventional randomizer. More specifically, the MPEG synchronization byte within the main data packet is discarded (or deleted). Then, the remaining 187 bytes are randomized by using a pseudo random byte generated from within the data randomizer 122. Subsequently, the randomized data bytes are outputted to the post-processor 130.

However, when the inputted data correspond to the enhanced data packet, the MPEG synchronization byte among the four bytes included in the enhanced data packet is discarded (or deleted) and only the remaining 3 bytes are randomized. The remaining portion of the enhanced data excluding the MPEG header is not randomized and outputted directly to the post-processor 130. This is because a randomizing process has already been performed on the enhanced data in the randomizer/byte expander 112. The known data (or known data place holder) and the initialization data place holder included in the enhanced data packet may either be randomized or not be randomized, and only the information on the place holders is transmitted to the receiving system.

The data randomized or bypassed from the data randomizer 122 are inputted to the RS parity place holder inserter 131 of the post-processor 130. If the inputted data correspond to the 187-byte main data packet, the RS parity place holder inserter 131 inserts a 20-byte RS parity place holder at the end of the 187-byte data. Then, the RS parity place holder inserter 131 outputs the processed data to the data interleaver 132. Alternatively, if the inputted data correspond to the 187-byte enhanced data packet, a 20-byte RS parity place holder is inserted within the packet for a non-systematic RS-coding process that is to be performed in a later process. Thereafter, the bytes within the enhanced data packet are inserted in the remaining 187 byte places, which are then outputted to the data interleaver 132. The data interleaver 132 data interleaves the output of the RS parity place holder inserter 131 and outputs the interleaved data to the block processor 133.

The block processor 133 performed additional encoding only on the enhanced data outputted from the data interleaver 132. For example, if a 2-byte expansion has been performed in the randomizer/byte expander 112, the block processor 133 encodes the enhanced data at a 1/2 coding rate. Alternatively, if a 4-byte expansion has been performed in the randomizer/byte expander 112, the block processor 133 encodes the enhanced data at a 1/4 coding rate. In addition, the main data or the RS parity place holder are/is bypassed without any modification. Furthermore, the known data (or known data place holder) and the initialization data place holder may be bypassed without modification or replaced with the known data generated from the block processor 133 and then outputted.

The data encoded, replaced, and bypassed by the block processor 133 are inputted to the data deinterleaver 134. Then, the data deinterleaver 134 performs an inverse process of the data interleaver 132, thereby deinterleaving the inputted data and outputted the deinterleaved data to the RS parity place holder remover 135. Herein, the RS parity place holder remover 135 removes the 20-byte RS parity place holder added by the RS parity place holder inserter 131 so that the data interleaver 12 and the data deinterleaver 134 may be operated. Thereafter, the parity place holder removed data are outputted to the RS encoder/non-systematic RS encoder 141. At this point, if the inputted data correspond to the main data packet, the last 20-byte PS parity place holders among the 207 bytes are removed. And, if the inputted data correspond to the enhanced data packet, the 20-byte RS parity place holders that are inserted in the 207 bytes in order to perform the non-systematic RS-coding process are removed. Herein, when the main data sequentially pass through the RS parity place holder inserter 131, the data interleaver 132, the block processor 133, the data deinterleaver 134, and the RS parity place holder remover 135, the processed main data become identical to the main data being inputted to the RS parity place holder inserter 131.

The RS encoder/non-systematic RS encoder 141 RS encodes the inputted data so as to add an 20-byte PR parity, thereby outputting the processed and parity-added data to the data interleaver 142. At this point, if the inputted data correspond to the main data packet, the RS encoder/non-systematic RS encoder 141 performs a systematic RS-coding process identical to that of the conventional broadcast system on the inputted data, thereby adding the 20-byte RS parity at the end of the 187-byte data. Alternatively, if the inputted data correspond to the enhanced data packet, each place of the 20 parity bytes is decided within the packet. Thereafter, the 20 bytes of RS parity gained by performing the non-systematic RS-coding are respectively inserted in the decided parity byte places.

The data interleaver 142 corresponds to a byte unit convolutional interleaver. The same interleaving rule as that of the above-described (first) data interleaver 132 is applied to the (second) data interleaver 142 mentioned herein. The (second) data interleaver 142 performs exactly the same operation as that of the (first) data interleaver 132. However, the two data interleavers 132 and 142 are differentiated from one another for simplicity of the description with respect to the position of each data interleaver. Similarly, the (second) data deinterleaver 134 performs exactly the same operation as that of the (first) data deinterleaver 114. The two data deinterleavers 114 and 134 are also differentiated from one another for simplicity of the description with respect to the position of each data deinterleaver. Herein, the data deinterleaver performed the inverse process of the data interleaver. Therefore, when a particular input sequence is inputted to the data interleaver so as to obtain (or output) an output sequence, and when the obtained output sequence is inputted to the data deinterleaver, the output obtained from the data deinterleaver becomes identical to the particular input sequence initially inputted to the data interleaver. The output of the data interleaver 142 is inputted to the parity replacer 143 and the non-systematic RS encoder 144.

Meanwhile, a memory within the trellis encoding module 145 should first be initialized in order to allow the output data of the trellis encoding module 145, which is positioned after the parity replacer 143, to become the known data defined based upon an agreement between the receiving system and the transmitting system. More specifically, the memory of the trellis encoding module 145 should first be initialized before the known data sequence being inputted is encoded. At this point, the beginning of the known data sequence that is inputted corresponds to the initialization data place holder included by the group formatter 113 and not the actual known data. Therefore, a process of generating initialization data right before the trellis-encoding of the known data sequence being inputted and a process of replacing the initialization data place holder of the corresponding trellis encoder memory with the newly generated initialization data are required. This is to ensure the backward-compatibility with the conventional receiving system.

Additionally, the value of the trellis memory initialization data is decided in accordance with a previous state of the memory in the trellis encoding module 145, and the initialization data are generated accordingly. Furthermore, due to the replaced initialization data, a process of recalculating the RS parity and a process of replacing the newly calculated RS parity with the RS parity outputted from the data interleaver 142 are required. Therefore, the non-systematic RS encoder 144 receives the enhanced data packet including the initialization data place holder that is to be replaced with the initialization data from the data interleaver, and the non-systematic RS encoder 144 receives the initialization data from the trellis encoding module 145. Then, the non-systematic RS encoder 144 calculates a new non-systematic RS parity and outputs the newly calculated non-systematic RS parity to the parity replacer 143. Thereafter, the parity replacer 143 selects the output of the data interleaver 142 as the data within the enhanced data packet, and the parity replacer 143 selects the output of the non-systematic RS encoder 144 as the RS parity.

Meanwhile, when the main data packet is inputted or when the enhanced data packet, which does not include the initialization data place holder that is to be replaced, is inputted, the parity replacer 143 selects the data outputted from the data interleaver 142 and the RS parity and outputs the selects output data and RS parity to the trellis encoding module 145 without any modification. The trellis encoding module 145 modifies the byte-unit data to symbol-unit data. Then, the trellis encoding module 145 12-way interleaves and trellis-encodes the modified data, so as to output the processed data to the frame multiplexer 146. The frame multiplexer 146 inserts field and segment synchronization signals in the output of the trellis encoding module 145 and outputs the processed data to the transmitting unit 150. Herein, the transmitting unit 150 includes a pilot inserter 151, a modulator 152, and a radio frequency (RF) up-converter 153. The transmitting unit 150 operates identically as in the conventional transmitting system. Therefore, a detailed description of the same will be omitted for simplicity.

Packet Multiplexer

Figure 7:
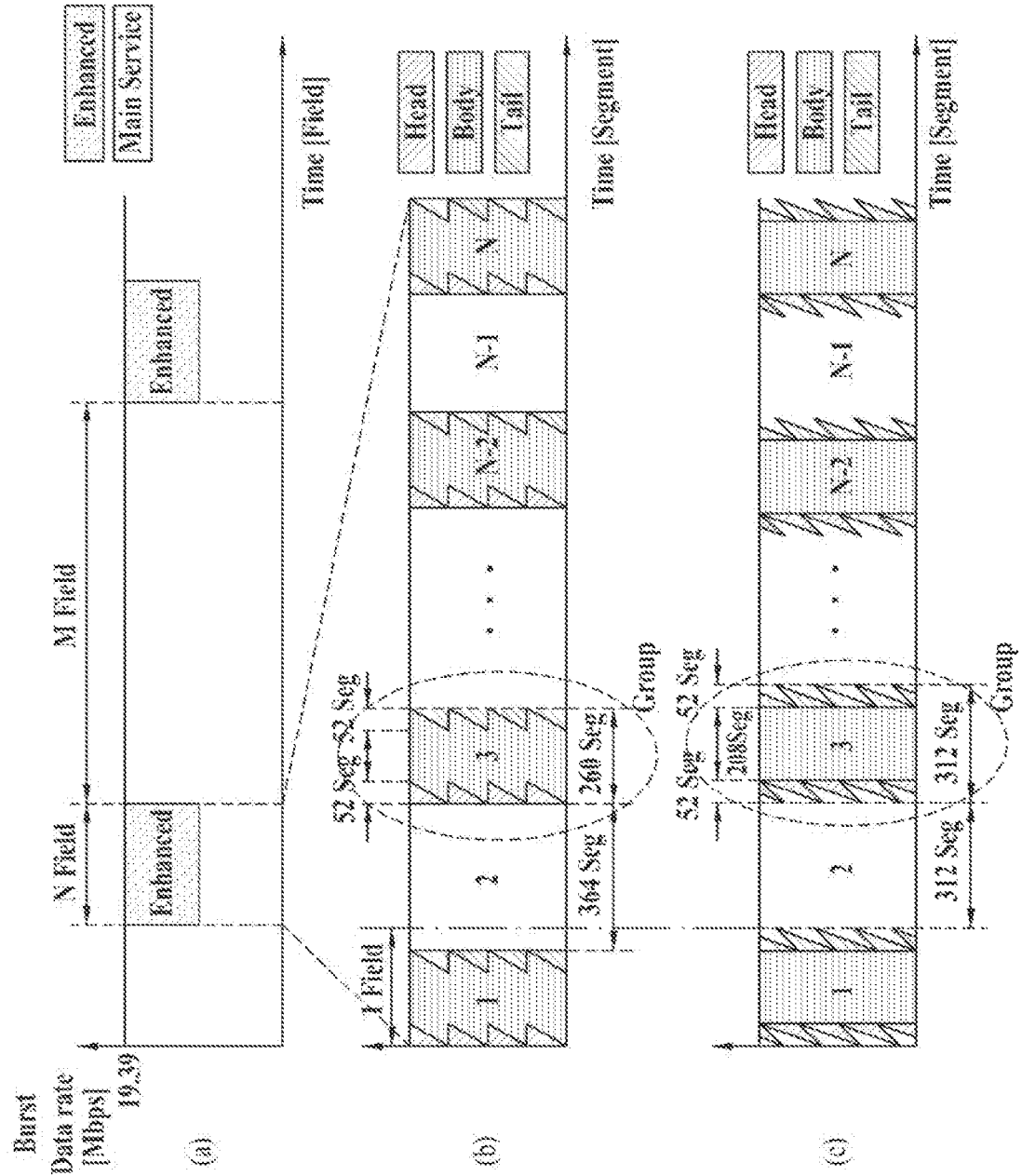
FIG. 7(a) to FIG. 7(c) illustrate process steps of packet multiplexing in a digital broadcast transmitting system according to the present invention.

The packet multiplexer 121 multiplexes a 188-byte enhanced data packet and the main data packet outputted from the packet formatter 115 and outputs the multiplexed data packets. The multiplexing method may be adjusted by various factors related to the design of the system according to the present invention. FIG. 7(a) to FIG. 7(c) illustrate an example of the process of multiplexing the enhanced data packet and the main data packet. Herein, the enhanced data are transmitted in burst units.

Referring to the time axis of FIG. 7(a), an enhanced data burst section occupying an N field and a main data section occupying an M field are repeated. In the N field, the enhanced data packet and the main data packet within the data group are multiplexed and outputted. And, in the M field, only the main data packet is outputted. FIG. 7(b) and FIG. 7(c) are enlargements of the enhanced data burst section having the length of N field along the time axis. More specifically, FIG. 7(b) is an enlargement of the enhanced data burst section along the time axis based upon the input of the (first) data interleaver 132 or the (second) data interleaver 142. And, FIG. 7(c) is an enlargement of the enhanced data burst section along the time axis based upon the output of the data interleaver. Referring to FIG. 7(c), the data group and the main data of one field is repeatedly transmitted. Herein, the enhanced data of the head and tail areas within the data group are alternately mixed with the main data in accordance with the output order of the interleaver. Therefore, the main data may be included in the field section wherein the data group is transmitted.

As shown in FIGS. 6(a) to 6(c), when a field occupied by the data group is positioned (or placed) at each of the very first and the very last fields within the enhanced data burst section, and when a field occupied by the main data is positioned between the two fields occupied by the data group, the total number (N) of fields included in the enhanced data burst section becomes an odd number. At this point, the enhanced data burst section and the main data section are not necessarily required to be in data field units and may be set to be in segment units. In addition, the enhanced data burst section and the main data section are not required to be periodically repeated. And, the amount of main data positioned between two neighboring data group within the enhanced data burst second may be modified in accordance with the design and regulations of the system. Further, when the enhanced data are transmitted in the above-described burst structure, and in a receiving system receiving only the enhanced data, the power is turned on only during the burst section so as to receive the data. On the other hand, during the main data section in which only the main data are received, the power is turned off so as to prevent the main data from being received, thereby reducing the amount of the power consumed in the receiving system.

As described above, the packet multiplexer 121 receives the main data packet and the data group outputted from the packet formatter 115 and transmits the received data to the burst structure shown in FIG. 7(a). At this point, as shown in FIG. 7(b), the data group and the main data packet within one enhanced data burst section are multiplexed and outputted. The output of the packet multiplexer 121 undergoes a series of process including the data interleaving process, and then, at the point the processed data are inputted to the frame multiplexer 146, the processed data are configured to have the enhanced data burst structure, as shown in FIG. 7(c). In this case, the structure of one data group includes a head area corresponding to the first 52 segments consisting of enhanced data alternately mixed with the main data, a body area corresponding to 20B segments consisting only of the main data, and a tail area corresponding to 52 segments consisting of enhanced data alternately mixed with the main data.

Figure 8:
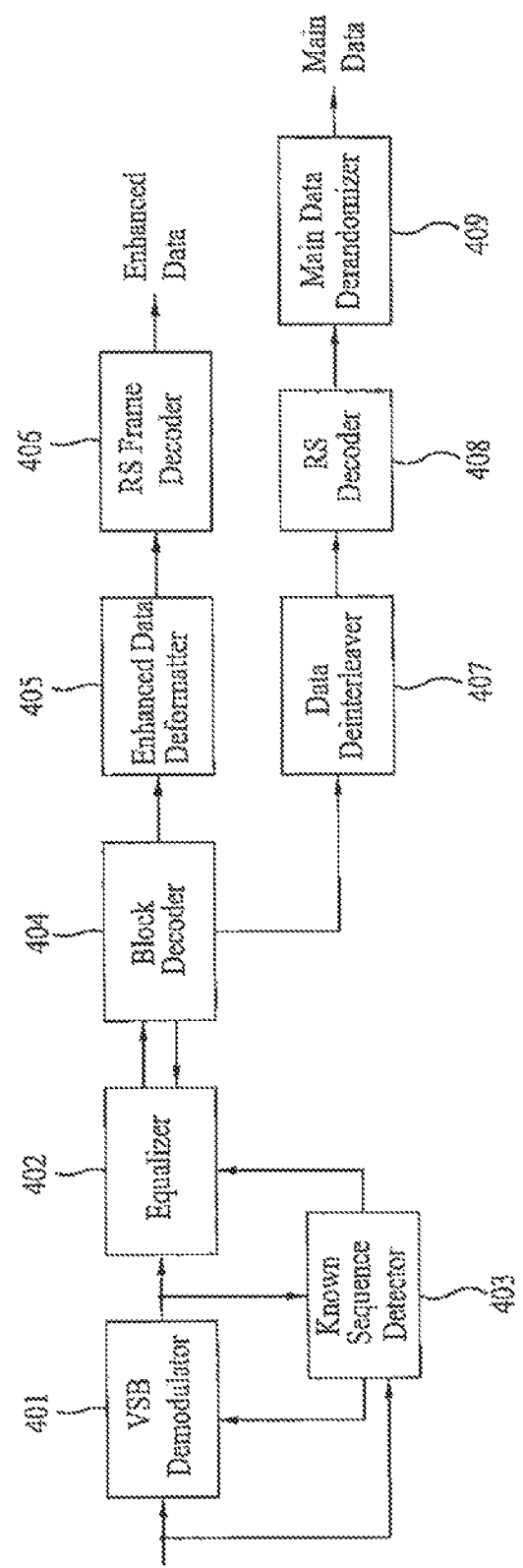
FIG. 8 illustrates a demodulating unit included a digital broadcast receiving system according to an embodiment of the present invention.

FIG. 8 illustrates an example of a demodulating unit included a digital broadcast receiving system receiving data transmitted by the above-described digital broadcast transmitting system, thereby recovering the received data to its initial state by demodulating and equalizing the received data. The demodulating unit according to the present invention, shown in FIG. 8, includes a demodulator 401, equalizer 402, a known sequence detector 403, a block decoder 404, a data deformatter 405, a RS frame decoder 406, a data deinterleaver 407, a RS decoder 408, and a main data derandomizer 409.

More specifically, the received signal through a tuner inputs to the demodulator 401 and the known sequence detector 403. The demodulator 401 performs automatic gain control, carrier recovery and timing recovery, etc., for the inputted signal to generate a baseband signal, and then output it to the equalizer 402 and the known sequence detector 403.

The equalizer 402 compensates the distortion of the channel included in the demodulated signal and then outputs the error-compensated signal to the block decoder 404.

At this point, the known sequence detector 403 detects the known data sequence place inserted by the transmitting end from the input/output data of the demodulator 401 (i.e., the data prior to the demodulation or the data after the modulation). Thereafter, the place information along with the symbol sequence of the known data sequence, which is generated from the detected place, is outputted to the demodulator 401, the equalizer 402, and the block decoder 404. Further, the known sequence detector 403 outputs information related to the enhanced data additionally encoded by the transmitting end and the main data that have not been additionally encoded to the block decoder 404. Herein, the outputted information is outputted to allow the enhanced data and the main data to be differentiated by the block decoder 404 of the receiving end and to find out the starting point of a block in the enhanced encoder. Although the connection state is not shown in FIG. 8, the information detected by the known sequence detector 403 may be used throughout almost the entire receiving system. Herein, the detected information may also be used in the data deformatter 405 and in the RS frame decoder 406.

The demodulator 401 uses the known data symbol sequence during the timing and/or carrier recovery, thereby enhancing the demodulating quality. Similarly, the equalizer 402 uses the known data sequence, thereby enhancing the equalizing quality. Furthermore, the decoding result of the block decoder 404 may also be fed-back to the equalizer 402, thereby enhancing the equalizing quality.

Meanwhile, when the data being inputted to the block decoder 404 correspond to the enhanced data being additionally coded and trellis-encoded by the transmitting end, the equalizer 402 performs an inverse process of the transmitting end by additionally decoding and trellis-decoding the inputted enhanced data. On the other hand, when the data being inputted correspond to the main data being trellis-encoded only and not additionally coded, the equalizer 402 only performs trellis-decoding on the inputted main data. The data group decoded by the block decoder 404 is inputted to the data deformatter 405, and the main data packet is inputted to the data deinterleaver 407. More specifically, when the inputted data correspond to the main data, the block decoder 404 performs Viterbi-decoding on the input data so as to output a hard decision value or to perform hard decision on a soft decision value and output the hard-decided result. Meanwhile, when the inputted data correspond to the enhanced data, the block decoder 404 outputs a hard decision value or a soft decision value on the inputted enhanced value.

When the inputted data correspond to the enhanced data, the block decoder 404 performs a decoding process on the data encoded by the block processor 133 and trellis encoding module 145 of the DTV transmitting system. At this point, the data outputted from the RS frame encoder 111 of the preprocessor 110 included in the DTV transmitting system may correspond to an external code, and the data outputted from each of the block processor 133 and the trellis encoding module 145 may correspond to an internal code.

When decoding such concatenated codes, the decoder of the internal code should output a soft decision value, so that the external coding performance can be enhanced. Therefore, the block decoder 404 may also output a hard decision value on the enhanced data and, preferably, a soft decision value may be outputted when required. More specifically, any one of a soft decision value and a hard decision value is outputted with respect to the enhanced data depending upon the overall design or conditions of the system, and a hard decision value is outputted with respect to the main data.

Meanwhile, the data deinterleaver 407, the RS decoder 408, and the main data derandomizer 409 are blocks required for receiving the main data. Therefore, these blocks may not be required in the structure of a DTV receiving system that only receives the enhanced data. The data deinterleaver 407 performs an inverse process of the data interleaver included in the DTV transmitting system. More specifically, the data deinterleaver 407 deinterleaves the main data and outputs the deinterleaved data to the RE decoder 408. The RS decoder 408 performs RS decoding on the deinterleaved data and outputs the RS-decoded data to the main data derandomizer 409. The main data derandomizer 409 receives the output of the RS decoder 408 and generates a pseudo random data byte identical to that of the randomizer included in the DTV transmitting system. Thereafter, the main data derandomizer 409 performs a bitwise exclusive OR (XOR) operation on the generated pseudo random data byte, thereby inserting the MPEG synchronization bytes to the beginning of each packet so as to output the data in 18-byte main data packet units.

The data being outputted from the block decoder 404 are inputted to the data deformatter 405 in the format of the data group, as shown in FIG. 5. At this point, the data deformatter 405 already knows the configuration of the input data. Therefore, the signaling information having the system information and enhanced data are differentiated in the body area within the data group. In addition, the data deformatter 405 removes the known data, trellis initialization data, and MPEG header that were inserted in the main data and data group and also removes the RS parity added by one of the RS encoder/non-systematic RS encoder 141 and non systematic RS encoder 144 of the DTV transmitting system.

Furthermore, a derandomizing process is performed as an inverse process of the randomizer/byte expander in the DTV transmitting system on the enhanced data. At this point, the null data byte used for the byte expansion by the byte expander may be or may not be required to be removed. In other words, depending upon design of the DTV receiving system, the removal of the byte, which has been expanded by the byte expander of the DTV transmitting system, may be required. However, if the null data byte inserted during the byte expansion is removed and outputted by the block decoder 404, the expanded byte is not required to be removed. However, if the removal of the expanded byte is required, the order of the byte removal process and the derandomizing process may vary depending upon the structure of the DTV transmitting system. More specifically, if the byte expansion is performed after the randomizing process in the DTV transmitting system, then the byte removal process is first performed before performing the derandomizing process in the DTV receiving system. Conversely, if the order of the process is changed in the DTV transmitting system, the order of the respective processes in the DTV receiving system is also changed.

When performing the derandomizing process, if the RS frame decoder 406 requires a soft decision in a later process, and if, therefore, the block decoder 404 receives a soft decision value it is difficult to perform an XOR operation between the soft decision and the pseudo random bit, which is used for the derandomizing process. Accordingly, when an XOR operation is performed between the pseudo random bit and the soft decision value of the enhanced data bit, and when the pseudo random bit is equal to '1', the data deformatter 405 changes the code of the soft decision value and then outputs the changed code. On the other hand, if the pseudo random bit is equal to '0', the data deformatter 405 outputs the soft decision value without any change in the code. Thus, the state of the soft decision may be maintained and transmitted to the RS frame decoder 406.

If the pseudo random bit is equal to '1' as described above, the code of the soft decision value is changed because, when an XOR operation is performed between the pseudo random bit and the input data in the randomizer of the transmitting system, and when the pseudo random bit is equal to '1', the code of the output data bit becomes the opposite of the input data (i.e., 0 XOR 1=1 and 1 XOR 0=0). More specifically, if the pseudo random bit generated from the data deformatter 405 is equal to '1', and when an XOR operation is performed on the hard decision value of the enhanced data bit, the XOR-operated value becomes the opposite value of the hard decision value. Therefore, when the soft decision value is outputted, a code opposite to that of the soft decision value is outputted.

The RS frame decoder 406 performs an inverse process of the RS frame encoder 11 in the DTV transmitting system. For example, if the block processor 133 of the transmitting system (or DTV transmitter) performs an encoding process at a 1/2 coding rate, then a RS frame having 85 packets (or rows) configured of 188 bytes is inputted to the RS frame decoder 406. The RS frame decoder 406 gathers (or groups) G number of such RS frames, thereby forming a RS frame group having 85*G number of RS frames. Furthermore, when using a 1-byte (i.e., 8-bit) CRC checksum, as shown in FIG. 4(*a*), each 188-byte packet is checked for any existing error. Thereafter, the 1-byte checksum is removed, thereby leaving 187 bytes. Subsequently, the presence of an error is marked on an error flag corresponding to the 187-byte packet. On the other hand, when using a 2-byte (i.e., 16-bit) CRC checksum, as shown in FIG. 4(*b*) and FIG. 4(*c*), each two 188-byte packets are checked for any existing error. Thereafter, the 2-byte checksums is removed, thereby creating two 187-byte packets. Subsequently, the presence of an error is marked on an error flag corresponding to each 187-byte packet. At this point, when using the 2-byte checksum, both packets should be marked to have an error or to have no error.

After performing an error check on each row using the checksum as described above, an inverse process of the row permutation process (shown in FIG. 3) is performed on the RS frame group configured of 85*G number of 187-byte packets. Thus, the 85*G number of 187-byte packets are aligned in the initial order prior to undergoing the row permutation process in the transmitting system. Thereafter, the RS frame group is divided into G number of RS frames configured of 85 187-byte packets. When performing the inverse process of the row permutation process, the error flag indicating the presence of an error in each packet (or row) is also converted and succeeded.

Each of the RS frames is configured to have the same structure as a byte matrix of 187×85. Subsequently, by decoding each of the 187 (85,67)-RS-coded columns within the RS frame, 67 187-byte rows may be obtained along with the error correction. Furthermore, the MPEG synchronization data byte, which was removed by the transmitting system, is added to the foremost end of each 187-byte row, thereby outputting the enhanced TS packet recovered to 188 bytes. At this point, when RS-decoding each of the RS frames, if the number of rows having error based upon the CRC error check result is equal to or smaller than the maximum number of errors that can be erasure-corrected when being RS-decoded in the column direction, an erasure correction process may be performed as the RS-decoding process, thereby maximizing the error correction ability.

Figure 9:
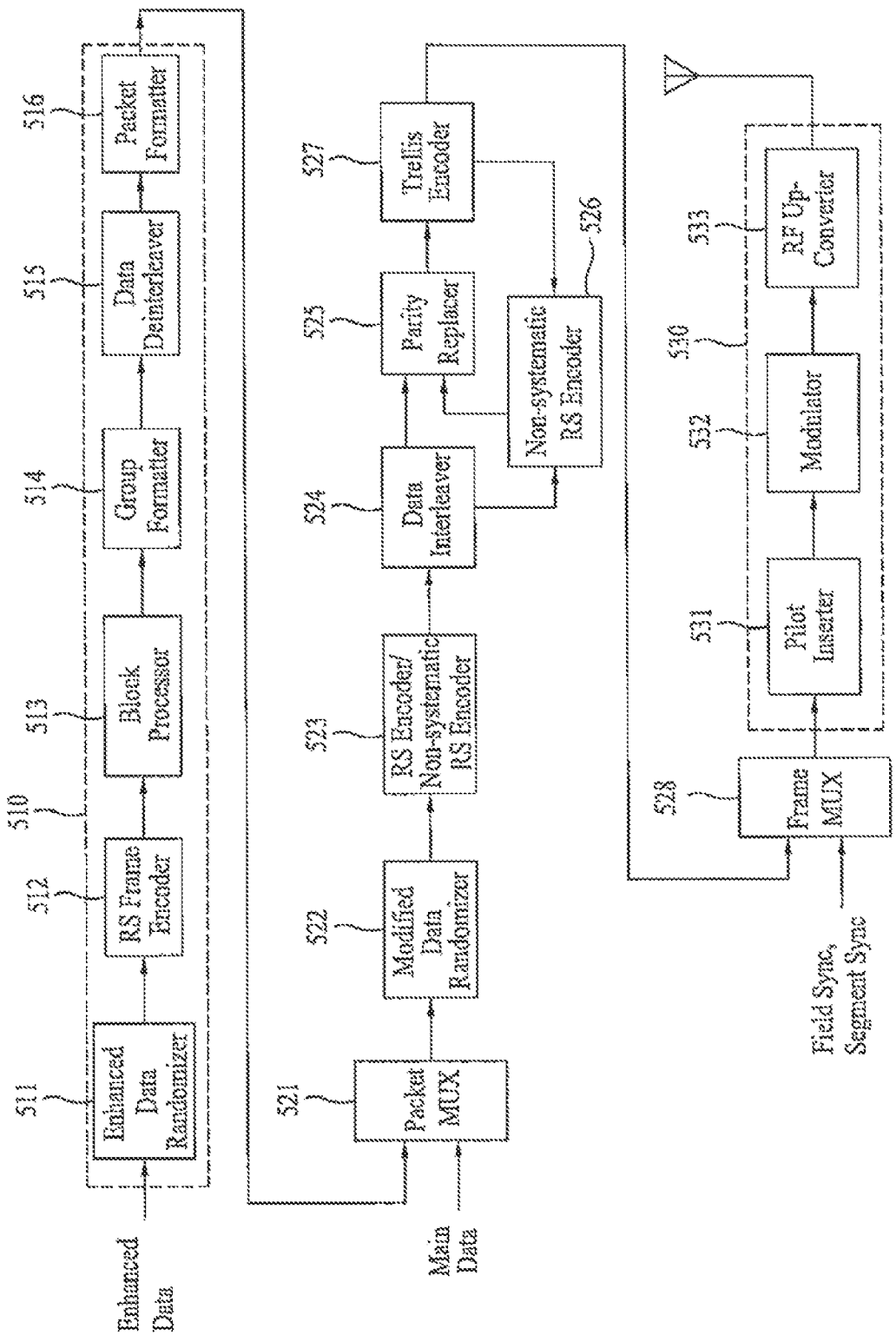
FIG. 9 illustrates a block diagram of a digital broadcast (or television or DTV) transmitting system according to another embodiment of the present invention.

FIG. 9 illustrates a block diagram showing the structure of a digital broadcast transmitting system according to an embodiment of the present invention. The digital broadcast transmitting system includes a pre-processor 510, a packet multiplexer 521, a data randomizer 522, a Reed-Solomon (RS) encoder/non-systematic RS encoder 523, a data interleaver 524, a parity byte replacer 525, a non-systematic RS encoder 526, a frame multiplexer 528, and a transmitting unit 530. The pre-processor 510 includes an enhanced data randomizer 511, a RS frame encoder 512, a block processor 513, a group formatter 514, a data deinterleaver 515, and a packet formatter 516.

In the present invention having the above-described structure, main data are inputted to the packet multiplexer 521. Enhanced data are inputted to the enhanced data randomizer 511 of the pre-processor 510, wherein an additional coding process is performed so that the present invention can respond swiftly and appropriately against noise and change in channel. The enhanced data randomizer 511 randomizes the received enhanced data and outputs the randomized enhanced data to the RS frame encoder 512. At this point, by having the enhanced data randomizer 511 perform the randomizing process on the enhanced data, the randomizing process on the enhanced data by the data randomizer 522 in a later process may be omitted. Either the randomizer of the conventional broadcast system may be used as the randomizer for randomizing the enhanced data, or any other type of randomizer may be used herein.

The RS frame encoder 512 receives the randomized enhanced data and performs at least one of an error correction coding process and an error detection coding process on the received data. Accordingly, by providing robustness to the enhanced data, the data can scatter group error that may occur due to a change in the frequency environment. Thus, the data can respond appropriately to the frequency environment which is very poor and liable to change. The RS frame multiplexer 512 also includes a process of mixing in row units many sets of enhanced data each having a pre-determined size. By performing an error correction coding process on the inputted enhanced data, the RS frame encoder 512 adds data required for the error correction and, then, performs an error detection coding process, thereby adding data required for the error detection process. The error correction coding uses the RS coding method, and the error detection coding uses the cyclic redundancy check (CRC) coding method. When performing the RS coding process, parity data required for the error correction are generated. And, when performing the CRC coding process, CRC data required for the error detection are generated.

The RS frame encoder 512 performs CRC coding on the RS coded enhanced data in order to create the CRC code. The CRC code that is generated by the CRC coding process may be used to indicate whether the enhanced data have been damaged by an error while being transmitted through the channel. The present invention may adopt other types of error detection coding methods, apart from the CRC coding method, and may also use the error correction coding method so as to enhance the overall error correction ability of the receiving system. For example, assuming that the size of one RS frame is 187*N bytes, that (235,187)-RS coding process is performed on each column within the RS frame, and that a CRC coding process using a 2-byte (i.e., 16-bit) CRC checksum, then a RS frame having the size of 187*N bytes is expanded to a RS frame of 235*(N+2) bytes. The RS frame expanded by the RS frame encoder 512 is inputted to the block processor 513. The block processor 513 codes the RS-coded and CRC-coded enhanced data at a coding rate of G/H. Then, the block processor 513 outputs the G/H-rate coded enhanced data to the group formatter 514. In order to do so, the block processor 513 identifies the block data bytes being inputted from the RS frame encoder 512 as bits.

The block processor 513 may receive supplemental information data such as signaling information, which include information on the system, and identifies the supplemental information data bytes as data bits. Herein, the supplemental information data, such as the signaling information, may equally pass through the enhanced data randomizer 511 and the RS frame encoder 512 so as to be inputted to the block processor 513. Alternatively, the supplemental information data may be directly inputted to the block processor 513 without passing through the enhanced data randomizer 511 and the RS frame encoder 512. The signaling information corresponds to information required for receiving and processing data included in the data group in the receiving system. Such signaling information includes data group information, multiplexing information, and burst information.

As a G/H-rate encoder, the block processor 513 codes the inputted data at a coding rate of G/H and then outputs the G/H-rate coded data. For example, if 1 bit of the input data is coded to 2 bits and outputted, then G is equal to 1 and H is equal to 2 (i.e., G=1 and H=2). Alternatively, if 1 bit of the input data is coded to 4 bits and outputted, then G is equal to 1 and H is equal to 4 (i.e., G=1 and H=4). As an example of the present invention, it is assumed that the block processor 513 performs a coding process at a coding rate of 1/2 (also referred to as a 1/2-rate coding process) or a coding process at a coding rate of 1/4 (also referred to as a 1/4-rate coding process). More specifically, the block processor 513 codes the received enhanced data and supplemental information data, such as the signaling information, at either a coding rate of 1/2 or a coding rate of 1/4. Thereafter, the supplemental information data, such as the signaling information, are identified and processed as enhanced data.

Since the 1/4-rate coding process has a higher coding rate than the 1/2-rate coding process, greater error correction ability may be provided. Therefore, in a later process, by allocating the 1/4-rate coded data in an area with deficient receiving performance within the group formatter 514, and by allocating the 1/2-rate coded data in an area with excellent receiving performance, the difference in the overall performance may be reduced. More specifically, in case of performing the 1/2-rate coding process, the block processor 513 receives 1 bit and codes the received 1 bit to 2 bits (i.e., 1 symbol). Then, the block processor 513 outputs the processed 2 bits (or 1 symbol). On the other hand, in case of performing the 1/4-rate coding process, the block processor 513 receives 1 bit and codes the received 1 bit to 4 bits (i.e., 2 symbols). Then, the block processor 513 outputs the processed 4 bits (or 2 symbols). Additionally, the block processor 513 performs a block interleaving process in symbol units on the symbol-coded data. Subsequently, the block processor 513 converts to bytes the data symbols that are block-interleaved and have the order rearranged.

The group formatter 514 inserts the enhanced data outputted from the block processor 513 (herein, the enhanced data may include supplemental information data such as signaling information including transmission information) in a corresponding area within the data group, which is configured according to a pre-defined rule. Furthermore, in relation with the data deinterleaving process, various types of places holders or known data are also inserted in corresponding areas within the data group.

At this point, the data group may be described by at least one hierarchical area. Herein, the data allocated to the each area may vary depending upon the characteristic of each hierarchical area. Additionally, each data group may be configured to include a field synchronization signal.

In another example given in the present invention, a data group is divided into A, B, and C regions in a data configuration prior to data deinterleaving.

Figure 10:
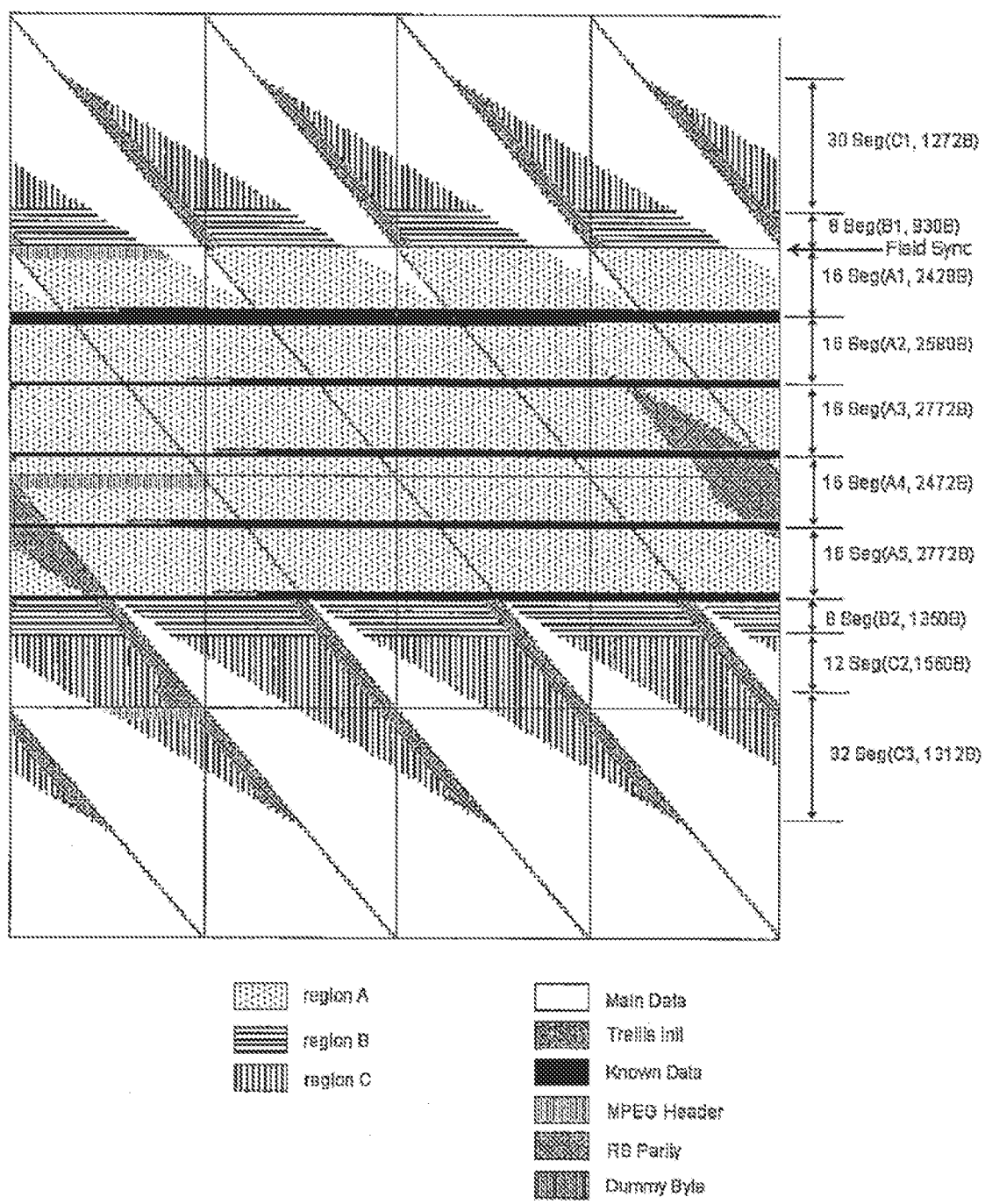
FIG. 10 and FIG. 11 illustrate another examples of data configuration at before and after ends of a data deinterleaver in a transmitting system according to the present invention.
Figure 11:
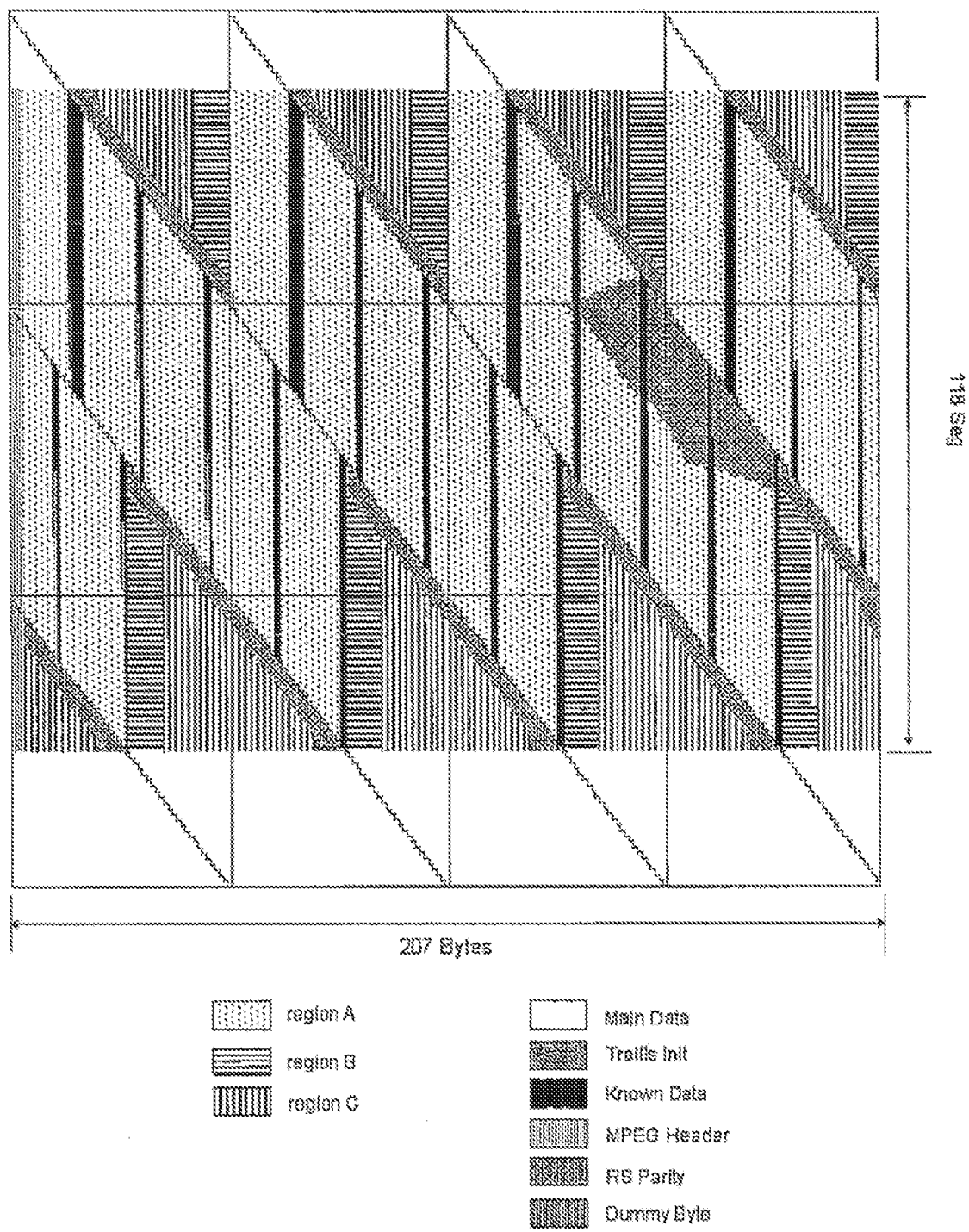

FIG. 10 illustrates an alignment of data after being data interleaved and identified, and FIG. 11 illustrates an alignment of data before being data interleaved and identified. More specifically, a data structure identical to that shown in FIG. 10 is transmitted to a receiving system. Also, the data group configured to have the same structure as the data structure shown in FIG. 10 is inputted to the data deinterleaver 515.

As described above, FIG. 10 illustrates a data structure prior to data deinterleaving that is divided into 3 regions, such as region A, region B, and region C. Also, in the present invention, each of the regions A to C is further divided into a plurality of regions. Referring to FIG. 10, region A is divided into 5 regions (A1 to A5), region B is divided into 2 regions (B1 and B2), and region C is divided into 3 regions (C1 to C3). Herein, regions A to C are identified as regions having similar receiving performances within the data group. Herein, the type of enhanced data, which are inputted, may also vary depending upon the characteristic of each region.

In the example of the present invention, the data structure is divided into regions A to C based upon the level of interference of the main data. Herein, the data group is divided into a plurality of regions to be used for different purposes. More specifically, a region of the main data having no interference or a very low interference level may be considered to have a more resistant (or stronger) receiving performance as compared to regions having higher interference levels. Additionally, when using a system inserting and transmitting known data in the data group, and when consecutively long known data are to be periodically inserted in the enhanced data, the known data having a predetermined length may be periodically inserted in the region having no interference from the main data (e.g., region A). However, due to interference from the main data, it is difficult to periodically insert known data and also to insert consecutively long known data to a region having interference from the main data (e.g., region B and region C).

Hereinafter, examples of allocating data to region A (A1 to A5), region B (B1 and B2), and region C (C1 to C3) will now be described in detail with reference to FIG. 10. The data group size, the number of hierarchically divided regions within the data group and the size of each region, and the number of enhanced data bytes that can be inserted in each hierarchically divided region of FIG. 10 are merely examples given to facilitate the understanding of the present invention. Herein, the group formatter 514 creates a data group including places in which field synchronization bytes are to be inserted, so as to create the data group that will hereinafter be described in detail.

More specifically, region A is a region within the data group in which a long known data sequence may be periodically inserted, and in which includes regions wherein the main data are not mixed (e.g., A1 to A5). Also, region A includes a region (e.g., A1) located between a field synchronization region and the region in which the first known data sequence is to be inserted. The field synchronization region has the length of one segment (i.e., 832 symbols) existing in an ATSC system.

For example, referring to FIG. 10, 2428 bytes of the enhanced data may be inserted in region A1, 2580 bytes may be inserted in region A2, 2772 bytes may be inserted in region A3, 2472 bytes may be inserted in region A4, and 2772 bytes may be inserted in region A5. Herein, trellis initialization data or known data, MPEG header, and RS parity are not included in the enhanced data. As described above, when region A includes a known data sequence at both ends, the receiving system uses channel information that can obtain known data or field synchronization data, so as to perform equalization, thereby providing enforced equalization performance.

Also, region B includes a region located within 8 segments at the beginning of a field synchronization region within the data group (chronologically placed before region A1) (e.g., region B1), and a region located within 8 segments behind the very last known data sequence which is inserted in the data group (e.g., region B2). For example, 930 bytes of the enhanced data may be inserted in the region B1, and 1350 bytes may be inserted in region B2. Similarly, trellis initialization data or known data, MPEG header, and RS parity are not included in the enhanced data. In case of region B, the receiving system may perform equalization by using channel information obtained from the field synchronization section. Alternatively, the receiving system may also perform equalization by using channel information that may be obtained from the last known data sequence, thereby enabling the system to respond to the channel changes.

Region C includes a region located within 30 segments including and preceding the $9^{th}$ segment of the field synchronization region (chronologically located before region A) (e.g., region C1), a region located within 12 segments including and following the $9^{th}$ segment of the very last known data sequence within the data group (chronologically located after region A) (e.g., region C2), and a region located in 32 segments after the region C2 (e.g., region C3). For example, 1272 bytes of the enhanced data may be inserted in the region C1, 1560 bytes may be inserted in region C2, and 1312 bytes may be inserted in region C3. Similarly, trellis initialization data or known data, MPEG header, and RS parity are not included in the enhanced data. Herein, region C (e.g., region C1) is located chronologically earlier than (or before) region A.

Since region C (e.g., region C1) is located further apart from the field synchronization region which corresponds to the closest known data region, the receiving system may use the channel information obtained from the field synchronization data when performing channel equalization. Alternatively, the receiving system may also use the most recent channel information of a previous data group. Furthermore, in region C (e.g., region C2 and region C3) located before region A, the receiving system may use the channel information obtained from the last known, data sequence to perform equalization. However, when the channels are subject to fast and frequent changes, the equalization may not be performed perfectly. Therefore, the equalization performance of region C may be deteriorated as compared to that of region B.

When it is assumed that the data group is allocated with a plurality of hierarchically divided regions, as described above, the block processor 513 may encode the enhanced data, which are to be inserted to each region based upon the characteristic of each hierarchical region, at a different coding rate. For example, the block processor 513 may encode the enhanced data, which are to be inserted in regions A1 to A5 of region A, at a coding rate of 1/2. Then, the group formatter 514 may insert the 1/2-rate encoded enhanced data to regions A1 to A5.

The block processor 513 may encode the enhanced data, which are to be inserted in regions 31 and B2 of region B, at a coding rate of 1/4 having higher error correction ability as compared to the 1/2-coding rate. Then, the group formatter 514 inserts the 1/4-rate coded enhanced data in region B1 and region B2. Furthermore, the block processor 513 may encode the enhanced data, which are to be inserted in regions C1 to C3 of region C, at a coding rate of 1/4 or a coding rate having higher error correction ability than the 1/4-coding rate. Then, the group formatter 514 may either insert the encoded enhanced data to regions C1 to C3, as described above, or leave the data in a reserved region for future usage.

In addition, the group formatter 514 also inserts supplemental data, such as signaling information that notifies the overall transmission information, other than the enhanced data in the data group. Also, apart from the encoded enhanced data outputted from the block processor 513, the group formatter 514 also inserts MPEG header place holders, non-systematic RS parity place holders, main data place holders, which are related to data deinterleaving in a later process, as shown in FIG. 10. Herein, the main data place holders are inserted because the enhanced data bytes and the main data bytes are alternately mixed with one another in regions B and C based upon the input of the data deinterleaver, as shown in FIG. 10. For example, based upon the data outputted after data deinterleaving, the place holder for the MPEG header may be allocated at the very beginning of each packet.

Furthermore, the group formatter 514 either inserts known data generated in accordance with a pre-determined method or inserts known data place holders for inserting the known data in a later process. Additionally, place holders for initializing the trellis encoder 527 are also inserted in the corresponding regions. For example, the initialization data place holders may be inserted in the beginning of the known data sequence. Herein, the size of the enhanced data that can be inserted in a data group may vary in accordance with the sizes of the trellis initialization place holders or known data (or known data place holders) MPEG header place holders, and RS parity place holders.

The output of the group formatter 514 is inputted to the data deinterleaver 515. And, the data deinterleaver 515 deinterleaves data by performing an inverse process of the data interleaver on the data and place holders within the data group, which are then outputted to the packet formatter 516. More specifically, when the data and place holders within the data group configured, as shown in FIG. 10, are deinterleaved by the data deinterleaver 515, the data group being outputted to the packet formatter 516 is configured to have the structure shown in FIG. 11.

Among the data deinterleaved and inputted, the packet formatter 516 removes the main data place holder and RS parity place holder that were allocated for the deinterleaving process from the inputted deinterleaved data. Thereafter, the remaining portion of the corresponding data is grouped, and 4 bytes of MPEG header are inserted therein. The 4-byte MPEG header is configured of a 1-byte MPEG synchronization byte added to the 3-byte MPEG header place holder.

When the group formatter 514 inserts the known data place holder, the packet formatter 516 may either insert actual known data in the known data place holder or output the known data place holder without any change or modification for a replacement insertion in a later process. Afterwards, the packet formatter 516 divides the data within the above-described packet-formatted data group into 188-byte unit enhanced data packets (i.e., MPEG TS packets), which are then provided to the packet multiplexer 521. The packet multiplexer 521 multiplexes the 188-byte unit enhanced data packet and main data packet outputted from the packet formatter 516 according to a pre-defined multiplexing method. Subsequently, the multiplexed data packets are outputted to the data randomizer 522. The multiplexing method may be modified or altered in accordance with diverse variables of the system design.

As an example of the multiplexing method of the packet multiplexer 521, the enhanced data burst section and the main data section may be identified along a time axis (or a chronological axis) and may be alternately repeated. At this point, the enhanced data burst section may transmit at least one data group, and the main data section may transmit only the main data. The enhanced data burst section may also transmit the main data. If the enhanced data are outputted in a burst structure, as described above, the receiving system receiving only the enhanced data may turn the power on only during the burst section so as to receive the enhanced data, and may turn the power off during the main data section in which main data are transmitted, so as to prevent the main data from being received, thereby reducing the power consumption of the receiving system.

When the data being inputted correspond to the main data packet, the data randomizer 522 performs the same randomizing process of the conventional randomizer. More specifically, the MPEG synchronization byte included in the main data packet is discarded and a pseudo random byte generated from the remaining 187 bytes is used so as to randomize the data. Thereafter, the randomized data are outputted to the RS encoder/non-systematic RS encoder 523. However, when the inputted data correspond to the enhanced data packet, the MPEG synchronization byte of the 4-byte MPEG header included in the enhanced data packet is discarded, and data randomizing is performed only on the remaining 3-byte MPEG header. Randomizing is not performed on the remaining portion of the enhanced data. Instead, the remaining portion of the enhanced data is outputted to the RS encoder/non-systematic RS encoder 523. This is because the randomizing process has already been performed on the enhanced data by the enhanced data randomizer 511 in an earlier process. Herein, a data randomizing process may or may not be performed on the known data (or known data place holder) and the initialization data place holder included in the enhanced data packet.

The RS encoder/non-systematic RS encoder 523 RS-codes the data randomized by the data randomizer 522 or the data bypassing the data randomizer 522. Then, the RS encoder/non-systematic RS encoder 523 adds a 20-byte RS parity to the coded data, thereby outputting the RS-parity-added data to the data interleaver 524. At this point, if the inputted data correspond to the main data packet, the RS encoder/non-systematic RS encoder 523 performs a systematic RS-coding process identical to that of the conventional receiving system on the inputted data, thereby adding the 20-byte RS parity at the end of the 187-byte data. Alternatively, if the inputted data correspond to the enhanced data packet, the 20 bytes of RS parity gained by performing the non-systematic RS-coding are respectively inserted in the decided parity byte places within the enhanced data packet. Herein, the data interleaver 524 corresponds to a byte unit convolutional interleaver. The output of the data interleaver 524 is inputted to the parity byte replacer 525 and the non-systematic RS encoder 526.

Meanwhile, a memory within the trellis encoding module 527, which is positioned after the parity byte replacer 525, should first be initialized in order to allow the output data of the trellis encoding module 527 so as to become the known data defined based upon an agreement between the receiving system and the transmitting system. More specifically, the memory of the trellis encoding module 527 should first be initialized before the known data sequence being inputted is trellis-encoded. At this point, the beginning of the known data sequence that is inputted corresponds to the initialization data place holder inserted by the group formatter 514 and not the actual known data. Therefore, a process of generating initialization data right before the trellis-encoding of the known data sequence being inputted and a process of replacing the initialization data place holder of the corresponding trellis encoding module memory with the newly generated initialization data are required.

A value of the trellis memory initialization data is decided based upon the memory status of the trellis encoding module 527, thereby generating the trellis memory initialization data accordingly. Due to the influence of the replace initialization data, a process of recalculating the RS parity, thereby replacing the RS parity outputted from the trellis encoding module 527 with the newly calculated RS parity is required. Accordingly, the non-systematic RS encoder 526 receives the enhanced data packet including the initialization data place holder that is to be replaced with the initialization data from the data interleaver 524 and also receives the initialization data from the trellis encoding module 527. Thereafter, among the received enhanced data packet, the initialization data place holder is replaced with the initialization data. Subsequently, the RS parity data added to the enhanced data packet are removed. Then, a new non-systematic RS parity is calculated and outputted to the parity byte replacer 525. Accordingly, the parity byte replacer 525 selects the output of the data interleaver 524 as the data within the enhanced data packet, and selects the output of the non-systematic RS encoder 526 as the RS parity. Thereafter, the parity byte replacer 525 outputs the selected data.

Figure 12:
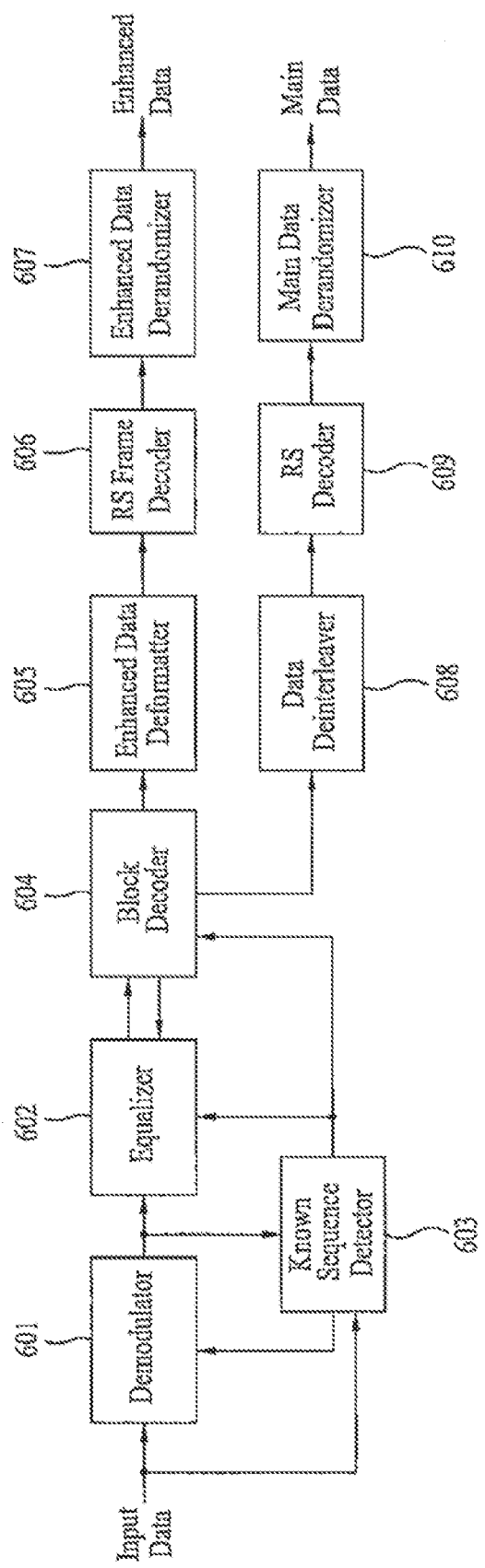
FIG. 12 illustrates a block diagram showing a general structure of a demodulating unit within a digital broadcast (or television or DTV) receiving system according to another embodiment of the present invention.

Meanwhile, if the main data packet is inputted, or if the enhanced data packet that does not include the initialization data place holder that is to be replaced, the parity byte replacer 525 selects the data and RS parity outputted from the data interleaver 524 and directly outputs the selected data to the trellis encoding module 527 without modification. The trellis encoding module 527 converts the byte-unit data to symbol-unit data and 12-way interleaves and trellis-encodes the converted data, which are then outputted to the frame multiplexer 528. The frame multiplexer 528 inserts field synchronization and segment synchronization signals in the output of the trellis encoding module 527 and then outputs the processed data to the transmitting unit 530. Herein, the transmitting unit 530 includes a pilot inserter 531, a modulator 532, and a radio frequency (RF) up-converter 533. The operation of the transmitting unit 530 is identical to the conventional transmitters. Therefore, a detailed description of the same will be omitted for simplicity, FIG. 12 illustrates a black diagram of a demodulating unit included in the receiving system according to another embodiment of the present invention. Herein, the demodulating unit may effectively process signals transmitted from the transmitting system shown in FIG. 9. Referring to FIG. 12, the demodulating unit includes a demodulator 601, a channel equalizer 602, a known sequence detector 603, a block decoder 604, an enhanced data deformatter 605, a RS frame decoder 606, an enhanced data derandomizer 607, a data deinterleaver 608, a RS decoder 609, and a main data derandomizer 910. For simplicity, the demodulator 601, the channel equalizer 602, the known sequence detector 603, the block decoder 604, the enhanced data deformatter 605, the RS frame decoder 606, and the enhanced data derandomizer 607 will be referred to as an enhanced data processor. And, the data deinterleaver 609, the RS decoder 609, and the main data derandomizer 910 will be referred to as a main data processor.

More specifically, the enhanced data including known data and the main data are received through the tuner and inputted to the demodulator 601 and the known sequence detector 603. The demodulator 601 performs automatic gain control, carrier wave recovery, and timing recovery on the data that are being inputted, thereby creating baseband data, which are then outputted to the equalizer 602 and the known sequence detector 603. The equalizer 602 compensates the distortion within the channel included in the demodulated data. Then, the equalizer 602 outputs the compensated data to the block decoder 604.

At this point, the known sequence detector 603 detects the known data place inserted by the transmitting system to the input/output data of the demodulator 601 (i.e., data prior to demodulation or data after demodulation). Then, along with the position information, the known sequence detector 603 outputs the symbol sequence of the known data generated from the corresponding position to the demodulator 601 and the equalizer 602. Additionally, the known sequence detector 603 outputs information enabling the block decoder 604 to identify the enhanced data being additionally encoded by the transmitting system and the main data that are not additionally encoded to the block decoder 604. Furthermore, although the connection is not shown in FIG. 12, the information detected by the known sequence detector 603 may be used in the overall receiving system and may also be used in the enhanced data formatter 605 and the RS frame decoder 606.

By using the known data symbol sequence when performing the timing recovery or carrier wave recovery, the demodulating performance of the demodulator 601 may be enhanced. Similarly, by using the known data, the channel equalizing performance of the channel equalizer 602 may be enhanced. Furthermore, by feeding-back the decoding result of the block decoder 604 to the channel equalizer 602, the channel equalizing performance may also be enhanced.

The equalizer 602 may perform channel equalization by using a plurality of methods. An example of estimating a channel impulse response (CIR) so as to perform channel equalization will be given in the description of the present invention. Most particularly, an example of estimating the CIR in accordance with each region within the data group, which is hierarchically divided and transmitted from the transmitting system, and applying each CIR differently will also be described herein. Furthermore, by using the known data, the place and contents of which is known in accordance with an agreement between the transmitting system and the receiving system, and the field synchronization data, so as to estimate the CIR, the present invention may be able to perform channel equalization with more stability.

Herein, the data group that is inputted for the equalization process is divided into regions A to C, as shown in FIG. 10. More specifically, in the example of the present invention, each region A, B, and C are further divided into regions A1 to A5, regions B1 and B2, and regions C1 to C3, respectively. Referring to FIG. 10, the CIR that is estimated from the field synchronization data in the data structure is referred to as CIR_FS. Alternatively, the CIRs that are estimated from each of the 5 known data sequences existing in region A are sequentially referred to as CIR_N0, CIR_N1, CIR_N2, CIR_N3, and CIR_N4.

As described above, the present invention uses the CIR estimated from the field synchronization data and the known data sequences in order to perform channel equalization on data within the data group. At this point, each of the estimated CIRs may be directly used in accordance with the characteristics of each region within the data group. Alternatively, a plurality of the estimated CIRs may also be either interpolated or extrapolated so as to create a new CIR, which is then used for the channel equalization process.

Herein, when a value F(Q) of a function F(x) at a particular point Q and a value F(S) of the function F(x) at another particular point S are known, interpolation refers to estimating a function value of a point within the section between points Q and S. Linear interpolation corresponds to the simplest form among a wide range of interpolation operations. The linear interpolation described herein is merely exemplary among a wide range of possible interpolation methods. And, therefore, the present invention is not limited only to the examples set forth herein.

Alternatively, when a value F(Q) of a function F(x) at a particular point Q and a value F(S) of the function F(x) at another particular point S are known, extrapolation refers to estimating a function value of a point outside of the section between points Q and S. Linear extrapolation is the simplest form among a wide range of extrapolation operations. Similarly, the linear extrapolation described herein is merely exemplary among a wide range of possible extrapolation methods. And, therefore, the present invention is not limited only to the examples set forth herein.

More specifically, in case of region C1, any one of the CIR_N4 estimated from a previous data group, the CIR_FS estimated from the current data group that is to be processed with channel equalization, and a new CIR generated by extrapolating the CIR_FS of the current data group and the CIR_N0 may be used to perform channel equalization. Alternatively, in case of region B1, a variety of methods may be applied as described in the case for region C1. For example, a new CIR created by linearly extrapolating the CIR_FS estimated from the current data group and the CIR_N0 may be used to perform channel equalization. Also, the CIR_FS estimated from the current data group may also be used to perform channel equalization. Finally, in case of region A1, a new CIR may be created by interpolating the CIR_FS estimated from the current data group and CIR_N0, which is then used to perform channel equalization. Furthermore, any one of the CIR_FS estimated from the current data group and CIR_N0 may be used to perform channel equalization.

In case of regions A2 to A5, CIR_N(i−1) estimated from the current data group and CIR_N(i) may be interpolated to create a new CIR and use the newly created CIR to perform channel equalization. Also, any one of the CIR_N(i−1) estimated from the current data group and the CIR_N(i) may be used to perform channel equalization. Alternatively, in case of regions B2, C2, and C3, CIR_N3 and CIR_N4 both estimated from the current data group may be extrapolated to create a new CIR, which is then used to perform the channel equalization process. Furthermore, the CIR_N4 estimated from the current data group may be used to perform the channel equalization process. Accordingly, an optimum performance may be obtained when performing channel equalization on the data inserted in the data group. The methods of obtaining the CIRs required for performing the channel equalization process in each region within the data group, as described above, are merely examples given to facilitate the understanding of the present invention. A wider range of methods may also be used herein. And, therefore, the present invention will not only be limited to the examples given in the description set forth herein.

Meanwhile, if the data being channel equalized and then inputted to the block decoder 604 correspond to the enhanced data on which additional encoding and trellis encoding are both performed by the transmitting system, trellis-decoding and additional decoding processes are performed as inverse processes of the transmitting system. Alternatively, if the data being channel equalized and then inputted to the block decoder 604 correspond to the main data on which additional encoding is not performed and only trellis-encoding is performed by the transmitting system, only the trellis-decoding process is performed. The data group decoded by the block decoder 604 is inputted to the enhanced data deformatter 605, and the main data packet is inputted to the data deinterleaver 608.

More specifically, if the inputted data correspond to the main data, the block decoder 604 performs Viterbi decoding on the inputted data, so as to either output a hard decision value or hard-decide a soft decision value and output the hard-decided result. On the other hand, if the inputted correspond to the enhanced data, the block decoder 604 outputs either a hard decision value or a soft decision value on the inputted enhanced data. In other words, if the data inputted to the block decoder 604 correspond to the enhanced data, the block decoder 604 performs a decoding process on the data encoded by the block processor and the trellis encoder of the transmitting system. At this point, the output of the RS frame encoder included in the pre-processor of the transmitting system becomes an external code, and the output of the block processor and the trellis encoder becomes an internal code. In order to show maximum performance of the external code when decoding such connection codes, the decoder of the internal code should output a soft decision value. Therefore, the block decoder 604 may output a hard decision value on the enhanced data. However, when required, it is more preferable that the block decoder 604 outputs a soft decision value.

The present invention may also be used for configuring a reliability map using the soft decision value. The reliability map determines and indicates whether a byte corresponding to a group of 8 bits decided by the code of the soft decision value is reliable. For example, when an absolute value of the soft decision value exceeds a pre-determined threshold value, the value of the bit corresponding to the soft decision value code is determined to be reliable. However, if the absolute value does not exceed the pre-determined threshold value, then the value of the corresponding bit is determined to be not reliable. Further, if at least one bit among the group of 8 bits, which are determined based upon the soft decision value, is determined to be not reliable, then the reliability map indicates that the entire byte is not reliable. Herein, the process of determining the reliability by 1-bit units is merely exemplary. The corresponding byte may also be indicated to be not reliable if a plurality of bits (e.g., 4 bits) is determined to be not reliable.

Conversely, when all of the bits are determined to be reliable within one byte (i.e., when the absolute value of the soft value of all bits exceeds the pre-determined threshold value), then the reliability map determines and indicates that the corresponding data byte is reliable. Similarly, when more than 4 bits are determined to be reliable within one data byte, then the reliability map determines and indicates that the corresponding data byte is reliable. The estimated numbers are merely exemplary and do not limit the scope and spirit of the present invention. Herein, the reliability map may be used when performing error correction decoding processes.

Meanwhile, the data deinterleaver 608, the RS decoder 609, and the main data derandomizer 910 are blocks required for receiving the main data. These blocks may not be required in a receiving system structure that receives only the enhanced data. The data deinterleaver 608 performs an inverse process of the data interleaver of the transmitting system. More specifically, the data deinterleaver 608 deinterleaves the main data being outputted from the block decode 604 and outputs the deinterleaved data to the RS decoder 609. The RS decoder 509 performs systematic RS decoding on the deinterleaved data and outputs the systematically decoded data to the main data derandomizer 910. The main data derandomizer 910 receives the data outputted from the RS decoder 609 so as to generate the same pseudo random byte as that of the randomizer in the transmitting system. The main data derandomizer 910 then performs a bitwise exclusive OR (XOR) operation on the generated pseudo random data byte, thereby inserting the MPEG synchronization bytes to the beginning of each packet so as to output the data in 188-byte main data packet units.

Herein, the format of the data being outputted to the enhanced data deformatter 605 from the block decoder 604 is a data group format. At this point, the enhanced data deformatter 605 already knows the structure of the input data. Therefore, the enhanced data deformatter 605 identifies the system information including signaling information and the enhanced data from the data group. Thereafter, the identified signaling information is transmitted to where the system information is required, and the enhanced data are outputted to the RS frame decoder 606. The enhanced data deformatter 605 removes the known data, trellis initialization data, and MPEG header that were included in the main data and the data group and also removes the RS parity that was added by the RS encoder/non-systematic RS encoder of the transmitting system. Thereafter, the processed data are outputted to the RS frame decoder 606.

More specifically, the RS frame decoder 606 receives the RS-coded and CR-coded enhanced data from the enhanced data deformatter 605 so as to configure the RS frame. The RS frame decoder 606 performs an inverse process of the RS frame encoder included in the transmitting system, thereby correcting the errors within the RS frame. Then, the 1-byte MPEG synchronization byte, which was removed during the RS frame coding process, is added to the error corrected enhanced data packet. Subsequently, the processed data are outputted to the enhanced data derandomizer 607. Herein, the enhanced data derandomizer 607 performs a derandomizing process, which corresponds to an inverse process of the enhanced data randomizer included in the transmitting system, an the received enhanced data. Then, by outputting the processed data, the enhanced data transmitted from the transmitting system can be obtained.

According to an embodiment of the present invention, the RS frame decoder 606 may also be configured as follows. The RS frame decoder 606 may perform a CRC syndrome check on the RS frame, thereby verifying whether or not an error has occurred in each row. Subsequently, the CRC checksum is removed and the presence of an error is indicated on a CRC error flag corresponding to each row. Then, a RS decoding process is performed on the RS frame having the CRC checksum removed in a column direction. At this point, depending upon the number of CRC error flags, a RS erasure decoding process may be performed. More specifically, by checking the CRC error flags corresponding to each row within the RS frame, the number of CRC error flags may be determined whether it is greater or smaller than the maximum number of errors, when RS decoding the number of rows with errors (or erroneous rows) in the column direction. Herein, the maximum number of errors corresponds to the number of parity bytes inserted during the RS decoding process. As an example of the present invention, it is assumed that 48 parity bytes are added to each column.

If the number of rows with CRC errors is equal to or smaller than the maximum number of errors (e.g., 48), which may be corrected by the RS erasure decoding process, the RS erasure decoding process is performed on the RS frame in the column direction. Thereafter, the 48 bytes of parity data that were added at the end of each column are removed. However, if the number of rows with CRC errors is greater than the maximum number of errors (e.g. 48), which may be corrected by the RS erasure decoding process, the RS erasure decoding process cannot be performed. In this case, the error may be corrected by performing a general RS decoding process.

As another embodiment of the present invention, the error correction ability may be enhanced by using the reliability map created when configuring the RS frame from the soft decision value. More specifically, the RS frame decoder 606 compares the absolute value of the soft decision value obtained from the block decoder 604 to the pre-determined threshold value so as to determine the reliability of the bit values that are decided by the code of the corresponding soft decision value. Then, 8 bits are grouped to configure a byte. Then, the reliability information of the corresponding byte is indicated on the reliability map. Therefore, even if a specific row is determined to have CRC errors as a result of the CRC syndrome checking process of the corresponding row, it is not assumed that all of the data bytes included in the corresponding row have error. Instead, only the data bytes that are determined to be not reliable, after referring to the reliability information on the reliability map, are set to have errors. In other words, regardless of the presence of CRC errors in the corresponding row, only the data bytes that are determined to be not reliable (or unreliable) by the reliability map are set as erasure points.

Thereafter, if the number of erasure points for each column is equal to or smaller than the maximum number of errors (e.g., 48), the RS erasure decoding process is performed on the corresponding the column. Conversely, if the number of erasure points is greater than the maximum um number of errors (e.g., 48), which may be corrected by the RS erasure decoding process, a general decoding process is performed on the corresponding column in other words, if the number of rows having CRC errors is greater than the maximum number of errors (e.g., 48), which may be corrected by the RS erasure decoding process, either a RS erasure decoding process or a general RS decoding process is performed on a particular column in accordance with the number of erasure point within the corresponding column, wherein the number is decided based upon the reliability information on the reliability map. When the above-described process is performed, the error correction decoding process is performed in the direction of all of the columns included in the RS frame. Thereafter, the 48 bytes of parity data added to the end of each column are removed.

Figure 13:
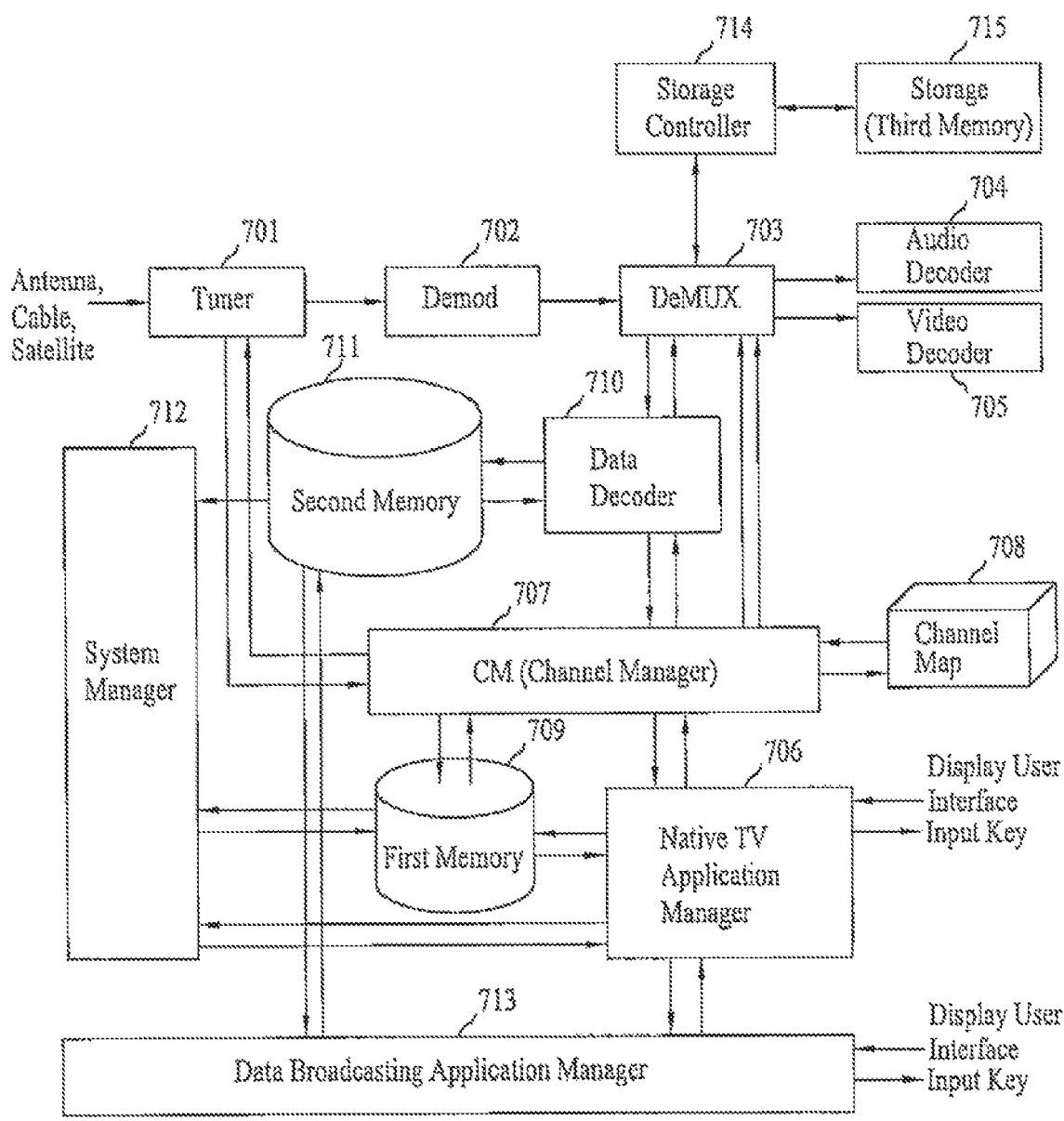
FIG. 13 illustrates a block diagram showing the structure of a digital broadcast (or television or DTV) receiving system according to an embodiment of the present invention.

FIG. 13 illustrates a block diagram showing the structure of a digital broadcast receiving system according to an embodiment of the present invention. Referring to FIG. 13, the digital broadcast receiving system includes a tuner 701, a demodulating unit 702, a demultiplexer 703, an audio decoder 704, a video decoder 705, a native TV application manager 706, a channel manager 707, a channel map 708, a first memory 709, a data decoder 710, a second memory 711, a system manager 712, a data broadcasting application manager 713, a storage controller 714, and a third memory 715. Herein, the third memory 715 is a mass storage device, such as a hard disk drive (HDD) or a memory chip. The tuner 701 tunes a frequency of a specific channel through any one of an antenna, cable, and satellite. Then, the tuner 701 down-converts the tuned frequency to an intermediate frequency (IP), which is then outputted to the demodulating unit 702. At this point, the tuner 701 is controlled by the channel manager 707. Additionally, the result and strength of the broadcast signal of the tuned channel are also reported to the channel manager 707. The data that are being received by the frequency of the tuned specific channel include main data, enhanced data, and table data for decoding the main data and enhanced data.

In the embodiment of the present invention, examples of the enhanced data may include data provided for data service, such as Java application data, HTML application data, XML data, and so on. The data provided for such data services may correspond either to a Java class file for the Java application, or to a directory file designating positions (or locations) of such files. Furthermore, such data may also correspond to an audio file and/or a video file used in each application. The data services may include weather forecast services, traffic information services, stock information services, services providing information quiz programs providing audience participation services, real time poll, user interactive education programs, gaming services, services providing information on soap opera (or TV series) synopsis, characters, original sound track, filing sites, services providing information on past sports matches, profiles and accomplishments of sports players, product information and product ordering services, services providing information on broadcast programs by media type, airing time, subject, and so on. The types of data services described above are only exemplary and are not limited only to the examples given herein. Furthermore, depending upon the embodiment of the present invention, the enhanced data may correspond to meta data. For example, the meta data use the XML application so as to be transmitted through a DSM-CC protocol.

The demodulating unit 702 performs demodulation and channel equalization on the signal being outputted from the tuner 701, thereby identifying the main data and the enhanced data. Thereafter, the identified main data and enhanced data are outputted in TS packet units. Examples of the demodulating unit 702 are shown in FIG. 8 and FIG. 12. The demodulating unit shown in FIG. 8 and FIG. 12 is merely exemplary and the scope of the present invention is not limited to the examples set forth herein. In the embodiment given as an example of the present invention, only the enhanced data packet outputted from the demodulating unit 702 is inputted to the demultiplexer 703. In this case, the main data packet is inputted to another demultiplexer (not shown) that processes main data packets. Herein, the storage controller 714 is also connected to the other demultiplexer in order to store the main data after processing the main data packets. The demultiplexer of the present invention may also be designed to process both enhanced data packets and main data packets in a single demultiplexer.

The storage controller 714 is interfaced with the demultiplexer so as to control instant recording, reserved (or pre-programmed) recording, time shift, and so on of the enhanced data and/or main data. For example, when one of instant recording, reserved (or pre-programmed) recording, and time shift is set and programmed in the receiving system (or receiver) shown in FIG. 13, the corresponding enhanced data and/or main data that are inputted to the demultiplexer are stored in the third memory 715 in accordance with the control of the storage controller 714. The third memory 715 may be described as a temporary storage area and/or a permanent storage area. Herein, the temporary storage area is used for the time shifting function, and the permanent storage area is used for a permanent storage of data according to the user's choice (or decision).

When the data stored in the third memory 715 need to be reproduced (or played), the storage controller 714 reads the corresponding data stored in the third memory 715 and outputs the read data to the corresponding demultiplexer (e.g., the enhanced data are outputted to the demultiplexer 703 shown in FIG. 3). At this point, according to the embodiment of the present invention, since the storage capacity of the third memory 715 is limited, the compression encoded enhanced data and/or main data that are being inputted are directly stored in the third memory 715 without any modification for the efficiency of the storage capacity. In this case, depending upon the reproduction (or reading) command, the data read from the third memory 715 pass trough the demultiplexer so as to be inputted to the corresponding decoder, thereby being restored to the initial state.

The storage controller 714 may control the reproduction (or play), fast-forward, rewind, slow motion, instant replay functions of the data that are already stored in the third memory 715 or presently being buffered. Herein, the instant replay function corresponds to repeatedly viewing scenes that the viewer (or user) wishes to view once again. The instant replay function may be performed on stored data and also on data that are currently being received in real time by associating the instant replay function with the time shift function. If the data being inputted correspond to the analog format, for example, if the transmission mode is NTSC, PAL, and so on, the storage controller 714 compression encodes the inputted data and stored the compression-encoded data to the third memory 715. In order to do so, the storage controller 714 may include an encoder, wherein the encoder may be embodied as one of software, middleware, and hardware. Herein, an MPEG encoder may be used as the encoder according to an embodiment of the present invention. The encoder may also be provided outside of the storage controller 714.

Meanwhile, in order to prevent illegal duplication (or copies) of the input data being stored in the third memory 715, the storage controller 714 scrambles the input data and stores the scrambled data in the third memory 715. Accordingly, the storage controller 714 may include a scramble algorithm for scrambling the data stored in the third memory 715 and a descramble algorithm for descrambling the data read from the third memory 715. Herein, the definition of scramble includes encryption, and the definition of descramble includes decryption. The scramble method may include using an arbitrary key (e.g., control word) to modify a desired set of data, and also a method of mixing signals.

Meanwhile, the demultiplexer 703 receives the real-time data outputted from the demodulating unit 702 or the data read from the third memory 715 and demultiplexes the received data. In the example given in the present invention, the demultiplexer 703 performs demultiplexing on the enhanced data packet. Therefore, in the present invention, the receiving and processing of the enhanced data will be described in detail. It should also be noted that a detailed description of the processing of the main data will be omitted for simplicity starting from the description of the demultiplexer 703 and the subsequent elements.

The demultiplexer 703 demultiplexes enhanced data and program specific information/program and system information protocol (PSI/PSIP) tables from the enhanced data packet inputted in accordance with the control of the data decoder 710. Thereafter, the demultiplexed enhanced data and PSI/PSIP tables are outputted to the data decoder 710 in a section format. In order to extract the enhanced data from the channel through which enhanced data are transmitted and to decode the extracted enhanced data, system information is required. Such system information may also be referred to as service information. The system information may include channel information, event information, etc. In the embodiment of the present invention, the PSI/PSIP tables are applied as the system information. However, the present invention is not limited to the example set forth herein. More specifically, regardless of the name, any protocol transmitting system information in a table format may be applied in the present invention.

The PSI table is an MPEG-2 system standard defined for identifying the channels and the programs. The PSIP table is an advanced television systems committee (ATSC) standard that can identify the channels and the programs. The PSI table may include a program association table (PAT), a conditional access table (CAT), a program map table (PMT), and a network information table (NIT). Herein, the PAT corresponds to special information that is transmitted by a data packet having a PID of '0'. The PAT transmits PID information of the PMT and PID information of the NIT corresponding to each program. The CAT transmits information on a paid broadcast system used by the transmitting system. The PMT transmits PID information of a transport stream (TS) packet, in which program identification numbers and individual bit sequences of video and audio data configuring the corresponding program are transmitted, and the PID information, in which PCR is transmitted. The NIT transmits information of the actual transmission network.

The PSIP table may include a virtual channel table (VCT), a system time table (STT), a rating region table (RRT), an extended text table (ETT), a direct channel change table (DCCT), an event information table (EIT), and a master guide table (MGT). The VCT transmits information on virtual channels, such as channel information for selecting channels and information such as packet identification (PID) numbers for receiving the audio and/or video data. More specifically, when the VCT is parsed, the PID of the audio/video data of the broadcast program may be known. Herein, the corresponding audio/video data are transmitted within the channel along with the channel name and the channel number. The STT transmits information on the current data and timing information. The RRT transmits information on region and consultation organs for program ratings. The ETT transmits additional description of a specific channel and broadcast program. The EIT transmits information on virtual channel events (e.g., program title, program start time, etc.). The DCCT/DCCSCT transmits information associated with automatic (or direct) channel change. And, the MGT transmits the versions and PID information of the above-mentioned tables included in the PSIP.

Each of the above-described tables included in the PSI/PSIP is configured of a basic unit referred to as a "section" and a combination of one or more sections forms a table. For example, the VCT may be divided into 256 sections. Herein, one section may include a plurality of virtual channel information. However, a single set of virtual channel information is not divided into two or more sections. At this point, the receiving system may parse and decode the data for the data service that are transmitting by using only the tables included in the PSI, or only the tables included in the PSIP, or a combination of tables included in both the PSI and the PSIP. In order to parse and decode the data for the data service, at least one of the PAT and PMT included in the PSI, and the VCT included in the PSIP is required. For example, the PAT may include the system information for transmitting the data corresponding to the data service, and the PID of the PMT corresponding to the data service data (or program number). The PMT may include the PID of the TS packet used for transmitting the data service data. The VCT may include information on the virtual channel for transmitting the data service data, and the PID of the TS packet for transmitting the data service data.

Meanwhile, depending upon the embodiment of the present invention, a DVB-SI may be applied instead of the PSIP. The DVB-SI may include a network information table (NIT) a service description table (SDT), an event information table (EIT), and a time and data table (TDT). The DVB-SI may be used in combination with the above-described PSI. Herein, the NIT divides the services corresponding to particular network providers by specific groups. The NIT includes all tuning information that is used during the IRD set-up. The NIT may be used for informing or notifying any change in the tuning information. The SDT includes the service name and different parameters associated with each service corresponding to a particular MPEG multiplex. The EIT is used for transmitting information associated with all events occurring in the MPEG multiplex. The EIT includes information on the current transmission and also includes information selectively containing different transmission streams that may be received by the IRD. And, the TDT is used for updating the clock included in the IRD.

Furthermore, three selective SI tables (i.e., a bouquet associate table (BAT) a running status table (RST), and a stuffing table (ST)) may also be included. More specifically, the bouquet associate table (BAT) provides a service grouping method enabling the IRD to provide services to the viewers. Each specific service may belong to at least one 'bouquet' unit. A running status table (RST) section is used for promptly and instantly updating at least one event execution status. The execution status section is transmitted only once at the changing point of the event status. Other SI tables are generally transmitted several times. The stuffing table (ST) may be used for replacing or discarding a subsidiary table or the entire SI tables.

In the present invention, the enhanced data included in the payload within the TS packet consist of a digital storage media-command and control (DSM-CC) section format. However, the TS packet including the data service data may correspond either to a packetized elementary stream (PES) type or to a section type. More specifically, either the PES type data service data configure the TS packet, or the section type data service data configure the TS packet. The TS packet configured of the section type data will be given as the example of the present invention. At this point, the data service data are includes in the digital storage media-command and control (DSM-CC) section. Herein, the DSM-CC section is then configured of a 188-byte unit TS packet.

Furthermore, the packet identification of the TS packet configuring the DSM-CC section is included in a data service table (DST. When transmitting the DST, '0x95'? is assigned as the value of a stream_type field included in the service location descriptor of the PMT or the VCT. More specifically, when the PMT or VCT stream_type field value is '0x95', the receiving system may acknowledge that data broadcasting including enhanced data (i.e., the enhanced data) is being received. At this point, the enhanced data may be transmitted by a data carousel method. The data carousel method corresponds to repeatedly transmitting identical data on a regular basis.

At this point, according to the control of the data decoder 710, the demultiplexer 703 performs section filtering, thereby discarding repetitive sections and outputting only the non-repetitive sections to the data decoder 710. The demultiplexer 703 may also output only the sections configuring desired tables (e.g., VCT) to the data decoder 710 by section filtering. Herein, the VCT may include a specific descriptor for the enhanced data. However, the present invention does not exclude the possibilities of the enhanced data being included in other tables, such as the PMT. The section filtering method may include a method of verifying the PID of a table defined by the MGT, such as the VCT, prior to performing the section filtering process. Alternatively, the section filtering method may also include a method of directly performing the section filtering process without verifying the MGT, when the VCT includes a fixed PID (i.e., a base PID). At this point, the demultiplexer 703 performs the section filtering process by referring to a table_id field, a version_number field, a section_number field, etc.

As described above, the method of defining the PID of the VCT broadly includes two different methods. Herein, the PID of the VCT is a packet identifier required for identifying the VCT from other tables. The first method consists of setting the PID of the VCT so that it is dependent to the MGT. In this case, the receiving system cannot directly verify the VCT among the many PSI and/or PSIP tables. Instead, the receiving system must check the PID defined in the MGT in order to read the VCT. Herein, the MGT defines the PID, size, version number, and so on, of diverse tables. The second method consists of setting the PID of the VCT so that the PID is given a base PID value (or a fixed PID value), thereby being independent from the MGT. In this case, unlike in the first method, the VCT according to the present invention may be identified without having to verify every single PID included in the MGT. Evidently, an agreement on the base PID must be previously made between the transmitting system and the receiving system.

Meanwhile, in the embodiment of the present invention, the demultiplexer 703 may output only an application information table (AIT) to the data decoder 710 by section filtering. The AIT includes information on an application being operated in the receiving system for the data service. The AIT may also be referred to as an XAIT, and an AMT. Therefore, any table including application information may correspond to the following description. When the AIT is transmitted, a value of '0x05'? may be assigned to a stream_type field of the PMT. The AIT may include application information, such as application name, application version, application priority, application ID, application status (i.e., auto-start, user-specific settings, kill, etc.), application type (i.e., Java or HTML), position (or location) of stream including application class and data files, application platform directory, and location of application icon.

In the method for detecting application information for the data service by using the AIT, component_tag, original_network_id, transport_stream_id, and service_id fields may be used for detecting the application information. The component_tag field designates an elementary stream carrying a DSI of a corresponding object carousel. The original_network_id field indicates a DVB-SI original_network_id of the TS providing transport connection. The transport_stream_id field indicates the MPEG TS of the TS providing transport connection, and the service_id field indicates the DVB-SI of the service providing transport connection. Information on a specific channel may be obtained by using the original_network_id field, the transport_stream_id field, and the service_id field. The data service data, such as the application data, detected by using the above-described method may be stored in the second memory 711 by the data decoder 710.

The data decoder 710 parses the DSM-CC section configuring the demultiplexed enhanced data. Then, the enhanced data corresponding to the parsed result are stored as a database in the second memory 711. The data decoder 710 groups a plurality of sections having the same table identification (table_id) so as to configure a table, which is then parsed. Thereafter, the parsed result is stored as a database in the second memory 711. At this point, by parsing data and/or sections, the data decoder 710 reads all of the remaining actual section data that are not section-filtered by the demultiplexer 703. Then, the data decoder 710 stores the read data to the second memory 711. The second memory 711 corresponds to a table and data carousel database storing system information parsed from tables and enhanced data parsed from the DSM-CC section. Herein, a table_id field, a section_number field, and a last_section_number field included in the table may be used to indicate whether the corresponding table is configured of a single section or a plurality of sections. For example, TS packets having the PID of the VCT are grouped to form a section, and sections having table identifiers allocated to the VCT are grouped to form the VCT.

When the VCT is parsed, information on the virtual channel to which enhanced data are transmitted may be obtained. The obtained application identification information, service component identification information, and service information corresponding to the data service may either be stored in the second memory 711 or be outputted to the data broadcasting application manager 713. In addition, reference may be made to the application identification information, service component identification information, and service information in order to decode the data service data. Alternatively, such information may also prepare the operation of the application program for the data service. Furthermore, the data decoder 710 controls the demultiplexing of the system information table, which corresponds to the information table associated with the channel and events. Thereafter, an A.V PID list may be transmitted to the channel manager 707.

The channel manager 707 may refer to the channel map 708 in order to transmit a request for receiving system-related information data to the data decoder 710, thereby receiving the corresponding result. In addition, the channel manager 707 may also control the channel tuning of the tuner 701. Furthermore, the channel manager 707 may directly control the demultiplexer 703, so as to set up the A/V PID, thereby controlling the audio decoder 704 and the video decoder 705. The audio decoder 704 and the video decoder 705 may respectively decode and output the audio data and video data demultiplexed from the main data packet. Alternatively, the audio decoder 704 and the video decoder 705 may respectively decode and output the audio data and video data demultiplexed from the enhanced data packet. Meanwhile, when the enhanced data include data service data, and also audio data and video data, it is apparent that the audio data and video data demultiplexed by the demultiplexer 703 are respectively decoded by the audio decoder 704 and the video decoder 705. For example, an audio-coding (AC)-3 decoding algorithm may be applied to the audio decoder 704, and a MPEG-2 decoding algorithm may be applied to the video decoder 705.

Meanwhile, the native TV application manager 706 operates a native application program stored in the first memory 709, thereby performing general functions such as channel change. The native application program refers to software stored in the receiving system upon shipping of the product. More specifically, when a user request (or command) is transmitted to the receiving system through a user interface (UI), the native TV application manger 706 displays the user request on a screen through a graphic user interface (GUI), thereby responding to the user's request. The user interface receives the user request through an input device, such as a remote controller, a key pad, a jog controller, an a touch-screen provided on the screen, and then outputs the received user request to the native TV application manager 706 and the data broadcasting application manager 713. Furthermore, the native TV application manager 706 controls the channel manager 707, thereby controlling channel-associated, such as the management of the channel map 708, and controlling the data decoder 710. The native TV application manager 706 also controls the GUI of the overall receiving system, thereby storing the user request and status of the receiving system in the first memory 709 and restoring the stored information.

The channel manager 707 controls the tuner 701 and the data decoder 710, so as to managing the channel map 708 so that it can respond to the channel request made by the user. More specifically, channel manager 707 sends a request to the data decoder 710 so that the tables associated with the channels that are to be tuned are parsed. The results of the parsed tables are reported to the channel manager 707 by the data decoder 710. Thereafter, based on the parsed results, the channel manager 707 updates the channel map 708 and sets up a PID in the demultiplexer 703 for demultiplexing the tables associated with the data service data from the enhanced data.

The system manager 712 controls the booting of the receiving system by turning the power an or off. Then, the system manager 712 stores ROM images (including downloaded software images) in the first memory 709. More specifically, the first memory 709 stores management programs such as operating system (OS) programs required for managing the receiving system and also application program executing data service functions. The application program is a program processing the data service data stored in the second memory 711 so as to provide the user with the data service. If the data service data are stored in the second memory 711, the corresponding data service data are processed by the above-described application program or by other application programs, thereby being provided to the user. The management program and application program stored in the first memory 709 may be updated or corrected to a newly downloaded program. Furthermore, the storage of the stored management program and application program is maintained without being deleted even if the power of the system is shut down. Therefore, when the power is supplied the programs may be executed without having to be newly downloaded once again.

The application program for providing data service according to the present invention may either be initially stored in the first memory 709 upon the shipping of the receiving system, or be stored in the first 709 after being downloaded. The application program for the data service (i.e., the data service providing application program) stored in the first memory 709 may also be deleted, updated, and corrected. Furthermore, the data service providing application program may be downloaded and executed along with the data service data each time the data service data are being received.

When a data service request is transmitted through the user interface, the data broadcasting application manager 713 operates the corresponding application program stored in the first memory 709 so as to process the requested data, thereby providing the user with the requested data service. And, in order to provide such data service, the data broadcasting application manager 713 supports the graphic user interface (GUI). Herein, the data service may be provided in the form of text (or short message service (SMS)), voice message, still image, and moving image. The data broadcasting application manager 713 may be provided with a platform for executing the application program stored in the first memory 709. The platform may be, for example, a Java virtual machine for executing the Java program. Hereinafter, an example of the data broadcasting application manager 713 executing the data service providing application program stored in the first memory 709, so as to process the data service data stored in the second memory 711, thereby providing the user with the corresponding data service will now be described in detail.

Assuming that the data service corresponds to a traffic information service, the data service according to the present invention is provided to the user of a receiving system that is not equipped with an electronic map and/or a GPS system in the form of at least one of a text (or short message service (SMS)), a voice message, a graphic message, a still image, and a moving image. In this case, is a GPS module is mounted on the receiving system shown in FIG. 13, the GPS module receives satellite signals transmitted from a plurality of low earth orbit satellites and extracts the current position (or location) information (e.g., longitude, latitude, altitude), thereby outputting the extracted information to the data broadcasting application manager 713.

At this point, it is assumed that the electronic map including information on each link and nod and other diverse graphic information are stored in one of the second memory 711, the first memory 709, and another memory that is not shown. More specifically, according to the request made by the data broadcasting application manager 713, the data service data stored in the second memory 711 are read and inputted to the data broadcasting application manager 713. The data broadcasting application manager 713 translates (or deciphers) the data service data read from the second memory 711, thereby extracting the necessary information according to the contents of the message and/or a control signal.

Figure 14:
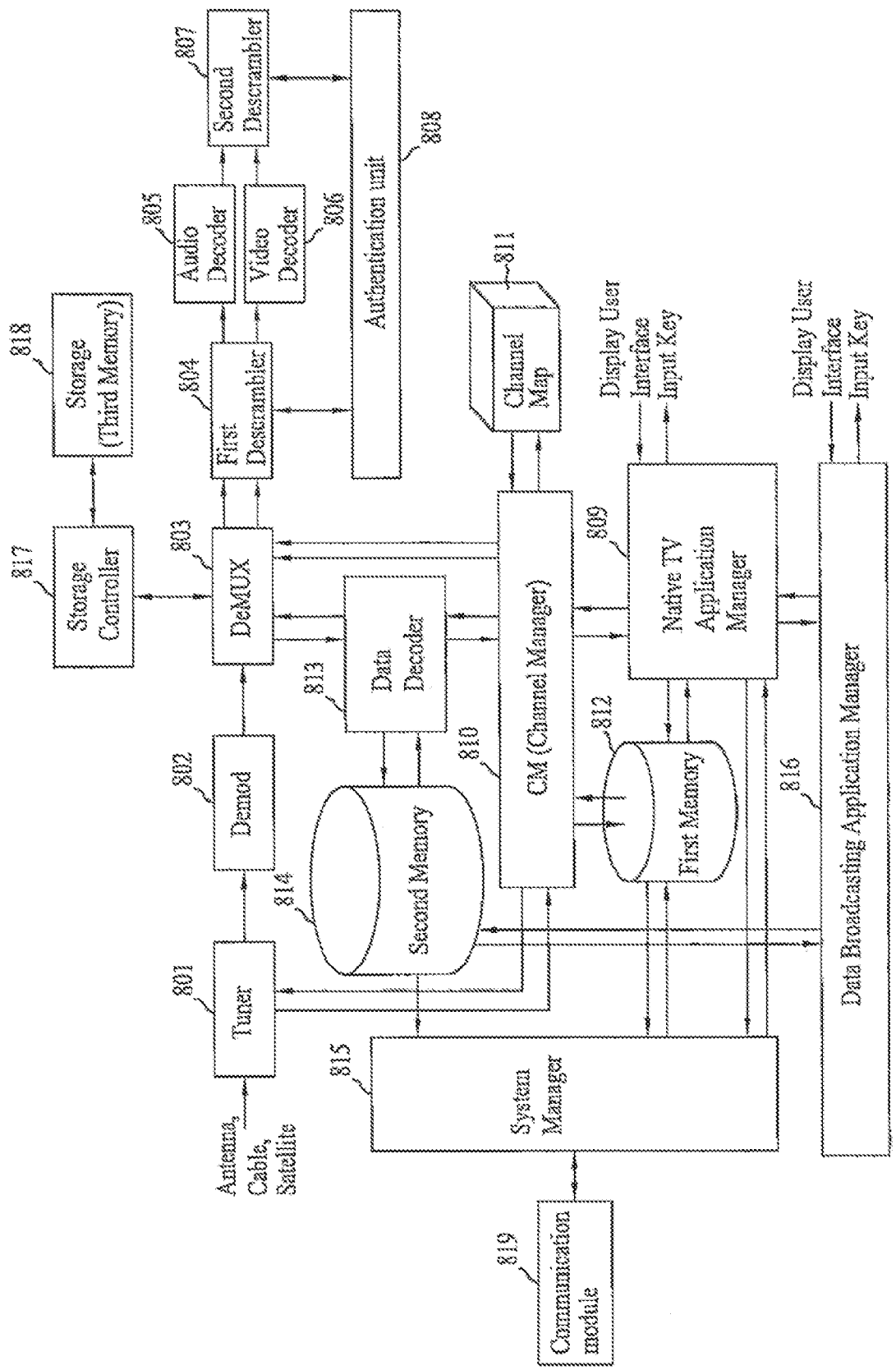
FIG. 14 illustrates a block diagram showing the structure of a digital broadcast (or television or DTV) receiving system according to another embodiment of the present invention.

FIG. 14 illustrates a block diagram showing the structure of a digital broadcast (or television) receiving system according to another embodiment of the present invention. Referring to FIG. 14, the digital broadcast receiving system includes a tuner 801, a demodulating unit 802, a demultiplexer 803, a first descrambler 804, an audio decoder 805, a video decoder B06, a second descrambler 807, an authentication unit 808, a native TV application manager 809, a channel manager 810, a channel map 811, a first memory 812, a data decoder 813, a second memory 814, a system manager 815, a data broadcasting application manager 816, a storage controller 817, a third memory 818, and a telecommunication module 819. Herein, the third memory 818 is a mass storage device, such as a hard disk drive (HDD) or a memory chip. Also, during the description of the digital broadcast (or television or DTV) receiving system shown in FIG. 14, the components that are identical to those of the digital broadcast receiving system of FIG. 13 will be omitted for simplicity.

As described above, in order to provide services for preventing illegal duplication (or copies) or illegal viewing of the enhanced data and/or main data that are transmitted by using a broadcast network, and to provide paid broadcast services, the transmitting system may generally scramble and transmit the broadcast contents. Therefore, the receiving system needs to descrample the scrambled broadcast contents in order to provide the user with the proper broadcast contents. Furthermore, the receiving system may generally be processed with an authentication process with an authentication means before the descrambling process. Hereinafter, the receiving system including an authentication means and a descrambling means according to an embodiment of the present invention will now be described in detail.

According to the present invention, the receiving system may be provided with a descrambling means receiving scrambled broadcasting contents and an authentication means authenticating (or verifying) whether the receiving system is entitled to receive the descrambled contents. Hereinafter, the descrambling means will be referred to as first and second descramblers 804 and 807, and the authentication means will be referred to as an authentication unit 808. Such naming of the corresponding components is merely exemplary and is not limited to the terms suggested in the description of the present invention. For example, the units may also be referred to as a decryptor. Although FIG. 14 illustrates an example of the descramblers 804 and 807 and the authentication unit 808 being provided inside the receiving system, each of the descramblers 804 and 807 and the authentication unit 808 may also be separately provided in an internal or external module. Herein, the module may include a slot type, such as a SD or CF memory, a memory stick type, a USB type, and so on, and may be detachably fixed to the receiving system.

As described above, when the authentication process is performed successfully by the authentication unit 808, the scrambled broadcasting contents are descrambled by the descramblers 804 and 807, thereby being provided to the user. At this point, a variety of the authentication method and descrambling method may be used herein. However, an agreement on each corresponding method should be made between the receiving system and the transmitting system. Hereinafter, the authentication and descrambling methods will now be described, and the description of identical components or process steps will be omitted for simplicity.

The receiving system including the authentication unit 808 and the descramblers 804 and 807 will now be described in detail. The receiving system receives the scrambled broadcasting contents through the tuner 801 and the demodulating unit 802. Then, the system manager 815 decides whether the received broadcasting contents have been scrambled. Herein, the demodulating unit 802 may be included as a demodulating means according to embodiments of the present invention as described in FIG. 8 and FIG. 12. However, the present invention is not limited to the examples given in the description set forth herein. If the system manager 815 decides that the received broadcasting contents have been scrambled, then the system manager 815 controls the system to operate the authentication unit 808. As described above, the authentication unit 808 performs an authentication process in order to decide whether the receiving system according to the present invention corresponds to a legitimate host entitled to receive the paid broadcasting service. Herein, the authentication process may vary in accordance with the authentication methods.

For example, the authentication unit 808 may perform the authentication process by comparing an IP address of an IP datagram within the received broadcasting contents with a specific address of a corresponding host. At this point, the specific address of the corresponding receiving system (or host) may be a MAC address. More specifically, the authentication unit 808 may extract the IP address from the decapsulated IP datagram, thereby obtaining the receiving system information that is mapped with the IP address. At this point, the receiving system should be provided, in advance, with information (e.g., a table format) that can map the IP address and the receiving system information. Accordingly, the authentication unit 808 performs the authentication process by determining the conformity between the address of the corresponding receiving system and the system information of the receiving system that is mapped with the IP address. In other words, if the authentication unit 808 determines that the two types of information conform to one another, then the authentication unit 808 determines that the receiving system is entitled to receive the corresponding broadcasting contents.

In another example, standardized identification information is defined in advance by the receiving system and the transmitting system. Then, the identification information of the receiving system requesting the paid broadcasting service is transmitted by the transmitting system. Thereafter, the receiving system, determines whether the received identification information conforms with its own unique identification number, so as to perform the authentication process. More specifically, the transmitting system creates a database for storing the identification information (or number) of the receiving system requesting the paid broadcasting service. Then, if the corresponding broadcasting contents are scrambled, the transmitting system includes the identification information in the EMM, which is then transmitted to the receiving system.

If the corresponding broadcasting contents are scrambled, messages (e.g., entitlement control message (ECM), entitlement management message (EMM)), such as the CAS information, mode information, message position information, that are applied to the scrambling of the broadcasting contents are transmitted through a corresponding data header or anther data packet. The ECM may include a control word (CW) used for scrambling the broadcasting contents. At this point, the control word may be encoded with an authentication key. The EMM may include an authentication key and entitlement information of the corresponding data. Herein, the authentication key may be encoded with a receiving system-specific distribution key. In other words, assuming that the enhanced data are scrambled by using the control word, and that the authentication information and the descrambling information are transmitted from the transmitting system, the transmitting system encodes the CW with the authentication key and, then, includes the encoded CW in the entitlement control message (ECM), which is then transmitted to the receiving system. Furthermore, the transmitting system includes the authentication key used for encoding the CW and the entitlement to receive data (or services) of the receiving system (i.e., a standardized serial number of the receiving system that is entitled to receive the corresponding broadcasting service or data) in the entitlement management message (EMM), which is then transmitted to the receiving system.

Accordingly, the authentication unit 808 of the receiving system extracts the identification information of the receiving system and the identification information included in the EMM of the broadcasting service that is being received. Then, the authentication unit 808 determines whether the identification information conform to each other, so as to perform the authentication process. More specifically, if the authentication unit 808 determines that the information conform to each other, then the authentication unit 808 eventually determines that the receiving system is entitled to receive the request broadcasting service.

In yet another example, the authentication unit 808 of the receiving system may be detachably fixed to an external module. In this case, the receiving system is interfaced with the external module through a common interface (CI). In other words, the external module may receive the data scrambled by the receiving system through the common interface, thereby performing the descrambling process of the received data. Alternatively, the external module may also transmit only the information required for the descrambling process to the receiving system. The common interface is configured on a physical layer and at least one protocol layer. Herein, in consideration of any possible expansion of the protocol layer in a later process, the corresponding protocol layer may be configured to have at least one layer that can each provide an independent function.

The external module may either consist of a memory or card having information on the key used for the scrambling process and other authentication information but not including any descrambling function, or consist of a card having the above-mentioned key information and authentication information and including the descrambling function. Both the receiving system and the external module should be authenticated in order to provide the user with the paid broadcasting service provided (or transmitted) from the transmitting system. Therefore, the transmitting system can only provide the corresponding paid broadcasting service to the authenticated pair of receiving system and external module.

Additionally, an authentication process should also be performed between the receiving system and the external module through the common interface. More specifically, the module may communicate with the system manager 815 included in the receiving system through the common interface, thereby authenticating the receiving system. Alternatively, the receiving system may authenticate the module through the common interface. Furthermore, during the authentication process, the module may extract the unique ID of the receiving system and its own unique ID and transmit the extracted ID to the transmitting system. Thus, the transmitting system may use the transmitted ID values as information determining whether to start the requested service or as payment information. Whenever necessary, the system manager 815 transmits the payment information to the remote transmitting system through the telecommunication module 819.

The authentication unit 808 authenticates the corresponding receiving system and/or the external module. Then, if the authentication process is successfully completed, the authentication unit 808 certifies the corresponding receiving system and/or the external module as a legitimate system and/or module entitled to receive the requested paid broadcasting service. In addition, the authentication unit 808 may also receive authentication-associated information from a mobile telecommunications service provider to which the user of the receiving system is subscribed, instead of the transmitting system providing the requested broadcasting service. In this case, the authentication-association information may either be scrambled by the transmitting system providing the broadcasting service and, then, transmitted to the user through the mobile telecommunications service provider, or be directly scrambled and transmitted by the mobile telecommunications service provider. Once the authentication process is successfully completed by the authentication unit 808, the receiving system may descramble the scrambled broadcasting contents received from the transmitting system. At this point, the descrambling process is performed by the first and second descramblers 804 and 807. Herein, the first and second descramblers 804 and 807 may be included in an internal module or an external module of the receiving system.

The receiving system is also provided with a common interface for communicating with the external module including the first and second descramblers 804 and 807, so as to perform the descrambling process. More specifically, the first and second descramblers 804 and 807 may be included in the module or in the receiving system in the form of hardware, middleware or software. Herein, the descramblers 804 and 807 may be included in any one of or both of the module and the receiving system. If the first and second descramblers 804 and 807 are provided inside the receiving system, it is advantageous to have the transmitting system (i.e., at least any one of a service provider and a broadcast station) scramble the corresponding data using the same scrambling method.

Alternatively, if the first and second descramblers 804 and 807 are provided in the external module, it is advantageous to have each transmitting system scramble the corresponding data using different scrambling methods. In this case, the receiving system is not required to be provided with the descrambling algorithm corresponding to each transmitting system. Therefore, the structure and size of receiving system may be simplified and more compact. Accordingly, in this case, the external module itself may be able to provide CA functions, which are uniquely and only provided by each transmitting systems, and functions related to each service that is to be provided to the user. The common interface enables the various external modules and the system manager 815, which is included in the receiving system, to communicate with one another by a single communication method. Furthermore, since the receiving system may be operated by being connected with at least one or more modules providing different services, the receiving system may be connected to a plurality of modules and controllers.

In order to maintain successful communication between the receiving system and the external module, the common interface protocol includes a function of periodically checking the status of the opposite correspondent. By using this function, the receiving system and the external module is capable of managing the status of each opposite correspondent. This function also reports the user or the transmitting system of any malfunction that may occur in any one of the receiving system and the external module and attempts the recovery of the malfunction.

In yet another example, the authentication process may be performed through software. More specifically, when a memory card having CAS software downloaded, for example, and stored therein in advanced is inserted in the receiving system, the receiving system receives and loads the CAS software from the memory card so as to perform the authentication process. In this example, the GAS software is read out from the memory card and stored in the first memory 812 of the receiving system. Thereafter, the CAS software is operated in the receiving system as an application program. According to an embodiment of the present invention, the CAS software is mounted on (or stored) in a middleware platform and, then executed. A Java middleware will be given as an example of the middleware included in the present invention. Herein, the CAS software should at least include information required for the authentication process and also information required for the descrambling process.

Therefore, the authentication unit 808 performs authentication processes between the transmitting system and the receiving system and also between the receiving system and the memory card. At this point, as described above, the memory card should be entitled to receive the corresponding data and should include information on a normal receiving system that can be authenticated. For example, information on the receiving system may include a unique number, such as a standardized serial number of the corresponding receiving system. Accordingly, the authentication unit 808 compares the standardized serial number included in the memory card with the unique information of the receiving system, thereby performing the authentication process between the receiving system and the memory card.

If the CAS software is first executed in the Java middleware base, then the authentication between the receiving system and the memory card is performed. For example, when the unique number of the receiving system stored in the memory card conforms to the unique number of the receiving system read from the system manager 815, then the memory card is verified and determined to be a normal memory card that may be used in the receiving system. At this point, the CAS software may either be installed in the first memory 812 upon the shipping of the present invention, or be downloaded to the first memory 812 from the transmitting system or the module or memory card, as described above. Herein, the descrambling function may be operated by the data broadcasting application manger 816 as an application program.

Thereafter, the CAS software parses the EMM/ECM packets outputted from the demultiplexer 803, so as to verify whether the receiving system is entitled to receive the corresponding data, thereby obtaining the information required for descrambling (i.e., the CW) and providing the obtained CW to the descramblers 804 and 807. More specifically, the CAS software operating in the Java middleware platform first reads out the unique (or serial) number of the receiving system from the corresponding receiving system and compares it with the unique number of the receiving system transmitted through the EMM, thereby verifying whether the receiving system is entitled to receive the corresponding data. Once the receiving entitlement of the receiving system is verified, the corresponding broadcasting service information transmitted to the ECM and the entitlement of receiving the corresponding broadcasting service are used to verify whether the receiving system is entitled to receive the corresponding broadcasting service. Once the receiving system is verified to be entitled to receive the corresponding broadcasting service, the authentication key transmitted to the EMM is used to decode (or decipher) the encoded CW, which is transmitted to the ECM, thereby transmitting the decoded CW to the descramblers 804 and 807. Each of the descramblers 804 and 807 uses the CW to descramble the broadcasting service.

Meanwhile, the CAS software stored in the memory card may be expanded in accordance with the paid service which the broadcast station is to provide. Additionally, the CAS software may also include other additional information other than the information associated with the authentication and descrambling. Furthermore, the receiving system may download the CAS software from the transmitting system so as to upgrade (or update) the CAS software originally stored in the memory card. As described above, regardless of the type of broadcast receiving system, as long as an external memory interface is provided, the present invention may embody a CAS system that can meet the requirements of all types of memory card that may be detachably fixed to the receiving system. Thus, the present invention may realize maximum performance of the receiving system with minimum fabrication cost, wherein the receiving system may receive paid broadcasting contents such as broadcast programs, thereby acknowledging and regarding the variety of the receiving system. Moreover, since only the minimum application program interface is required to be embodied in the embodiment of the present invention, the fabrication cost may be minimized, thereby eliminating the manufacturer's dependence on. CAS manufacturers. Accordingly, fabrication costs of CAS equipments and management systems may also be minimized.

Meanwhile, the descramblers 804 and 807 may be included in the module either in the form of hardware or in the form of software. In this case, the scrambled data that being received are descrambled by the module and then demodulated. Also, if the scrambled data that are being received are stored in the third memory 818, the received data may be descrambled and then stored, or stored in the memory at the point of being received and then descrambled later on prior to being played (or reproduced). Thereafter, in case scramble/descramble algorithms are provided in the storage controller 817, the storage controller 817 scrambles the data that are being received once again and then stores the re-scrambled data to the third memory 818.

In yet another example, the descrambled broadcasting contents (transmission of which being restricted) are transmitted through the broadcasting network. Also, information associated with the authentication and descrambling of data in order to disable the receiving restrictions of the corresponding data are transmitted and/or received through the telecommunications module 819. Thus, the receiving system is able to perform reciprocal (or two-way) communication. The receiving system may either transmit data to the telecommunication module within the transmitting system or be provided with the data from the telecommunication module within the transmitting system. Herein, the data correspond to broadcasting data that are desired to be transmitted to or from the transmitting system, and also unique information (i.e., identification information) such as a serial number of the receiving system or MAC address.

The telecommunication module 819 included in the receiving system provides a protocol required for performing reciprocal (or two-way) communication between the receiving system, which does not support the reciprocal communication function, and the telecommunication module included in the transmitting system. Furthermore, the receiving system configures a protocol data unit (PDU) using a tag-length-value (TLV) coding method including the data that are to be transmitted and the unique information (or ID information). Herein, the tag field includes indexing of the corresponding PDU. The length field includes the length of the value field. And, the value field includes the actual data that are to be transmitted and the unique number (e.g., identification number) of the receiving system.

The receiving system may configure a platform that is equipped with the Java platform and that is operated after downloading the Java application of the transmitting system to the receiving system through the network. In this case, a structure of downloading the PDU including the tag field arbitrarily defined by the transmitting system from a storage means included in the receiving system and then transmitting the downloaded PDU to the telecommunication module 819 may also be configured. Also, the PDU may be configured in the Java application of the receiving system and then outputted to the telecommunication module 819. The PDU may also be configured by transmitting the tag value, the actual data that are to be transmitted, the unique information of the corresponding receiving system from the Java application and by performing the TLV coding process in the receiving system. This structure is advantageous in that the firmware of the receiving system is not required to be changed even if the data (or application) desired by the transmitting system is added.

The telecommunication module within the transmitting system either transmits the PDU received from the receiving system through a wireless data network or configures the data received through the network into a PDU which is transmitted to the host. At this point, when configuring the PDU that is to be transmitted to the host, the telecommunication module within the transmitting end may include unique information (e.g., IP address) of the transmitting system which is located in a remote location. Additionally, in receiving and transmitting data through the wireless data network, the receiving system may be provided with a common interface, and also provided with a WAP, CDMA 1x EV-DO, which can be connected through a mobile telecommunication base station, such as CDMA and GSM, and also provided with a wireless LAN, mobile internet, WiBro, WiMax, which can be connected through an access point. The above-described receiving system corresponds to the system that is not equipped with a telecommunication function. However, a receiving system equipped with telecommunication function does not require the telecommunication module 819.

The broadcasting data being transmitted and received through the above-described wireless data network may include data required for performing the function of limiting data reception. Meanwhile, the demultiplexer 803 receives either the real-time data outputted from the demodulating unit 802 or the data read from the third memory 818, thereby performing demultiplexing. In this embodiment of the present invention, the demultiplexer 803 performs demultiplexing on the enhanced data packet. Similar process steps have already been described earlier in the description of the present invention. Therefore, a detailed of the process of demultiplexing the enhanced data will be omitted for simplicity.

The first descrambler 804 receives the demultiplexed signals from the demultiplexer 803 and then descrambles the received signals. At this point, the first descrambler 804 may receive the authentication result received from the authentication unit 808 and other data required for the descrambling process, so as to perform the descrambling process. The audio decoder 805 and the video decoder 806 receive the signals descrambled by the first descrambler 804, which are then decoded and outputted. Alternatively, if the first descrambler 804 did not perform the descrambling process, then the audio decoder 805 and the video decoder 806 directly decode and output the received signals. In this case, the decoded signals are received and then descrambled by the second descrambler 807 and processed accordingly.

As described above, the present invention has the following advantages. More specifically, the present invention is highly protected against (or resistant to) any error that may occur when transmitting additional data through a channel. And, the present invention is also highly compatible to the conventional receiving system. Moreover, the present invention may also receive the additional data without any error even in channels having severe ghost effect and noise.

Additionally, by grouping a plurality of enhanced data packets, by layering the group to a plurality of areas when multiplexing the group with the main data and transmitting the multiplexed data, and by identifying the data type, processing method, and so on according to the characteristic of each layered area, the receiving function of the receiving system may be enhanced. Furthermore, by performing at least any one of the error correction coding process and the error detection coding process on the enhanced data, and by performing a row permutation process, the enhanced data may become robust, thereby being able to take strong countermeasures against the constantly changing channel environment. Finally, the present invention is even more effective in providing robustness when applied to mobile and portable receivers, which are also liable to a frequent change in channel and which require robustness against intense noise.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed:

1. A method for transmitting broadcast signals, the method comprising:
   first encoding mobile data for mobile service by adding parity bits;
   second encoding the first encoded mobile data;
   convolutional interleaving the second encoded mobile data;
   forming a data unit including the convolutional interleaved mobile data, wherein the data unit includes a first region and a second region, and the first region includes signaling information; and
   transmitting the data unit multiplexed with main data for main service in a signal frame, wherein the signaling information includes multiplexing information.

2. The method of claim 1, further comprising:
   inserting known data into the data unit, wherein the known data is used for channel equalization.

3. The method of claim 2, wherein the known data is inserted periodically.

4. The method of claim 3, wherein at least one known data is spaced regularly apart.

5. The method of claim 1, wherein the signaling information includes a coding rate of the mobile data.

6. An apparatus for transmitting broadcast signals, the apparatus comprising:
   a first encoder configured to perform first encoding on mobile data for mobile service by adding parity bits;
   a second encoder configured to perform second encoding on the first encoded mobile data;
   a convolutional interleaver configured to perform convolutional interleaving on the second encoded mobile data;
   a formatter configured to form a data unit including the convolutional interleaved mobile data, wherein the data unit includes a first region and a second region, and the first region includes signaling information; and
   a transmitter configured to transmit the data unit multiplexed with main data for main service in a signal frame, wherein the signaling information includes multiplexing information.

7. The apparatus of claim 6, wherein the apparatus further inserts known data into the data unit, wherein the known data is used for channel equalization.

8. The apparatus of claim 7, wherein the known data is inserted periodically.

9. The apparatus of claim 8, wherein at least one known data is spaced regularly apart.

10. The apparatus of claim 6, wherein the signaling information includes a coding rate of the mobile data.

11. A method for receiving broadcast signals, the method comprising:
    receiving the broadcast signals having a signal frame, wherein the signal frame includes a plurality of multiplexed data units, wherein each of the plurality of multiplexed data units includes mobile data for mobile service or main data for main service, wherein each data unit includes mobile data comprising a first region and a second region, the first region includes signaling information, and the signaling information includes multiplexing information;
    convolutional de-interleaving the mobile data;
    first decoding the de-interleaved mobile data; and
    second decoding the first decoded mobile data.

12. The method of claim 11, further comprising:
    detecting known data from the signal frame, wherein the known data is used for channel equalization.

13. The method of claim 12, wherein the known data is inserted periodically into the data unit including the mobile data.

14. The method of claim 13, wherein at least one known data is spaced regularly apart.

15. The method of claim 11, wherein the signaling information includes a coding rate of the mobile data.

16. The method of claim 11, wherein a data unit including the mobile data is obtained by turning a power on.

17. An apparatus for receiving broadcast signals, the apparatus comprising:
    a receiving unit for receiving the broadcast signals having a signal frame, wherein the signal frame includes a plurality of multiplexed data units, wherein each of the plurality of multiplexed data unit includes mobile data for mobile service or main data for main service, wherein each data unit includes mobile data comprising a first region and a second region, the first region includes signaling information, and the signaling information includes multiplexing information;
    a convolutional de-interleaver for convolutional de-interleaving the mobile data;
    a first decoder for first decoding the de-interleaved mobile data; and
    a second decoder for second decoding the first decoded mobile data.

18. The apparatus of claim 17, further comprising:
    a detector configured to detect known data from the signal frame, wherein the known data is used for channel equalization.

19. The apparatus of claim 18, wherein the known data is inserted periodically into the data unit including the mobile data.

20. The apparatus of claim 19, wherein at least one known data is spaced regularly apart.

21. The apparatus of claim 17, wherein the signaling information includes a coding rate of the mobile data.

22. The apparatus of claim 17, wherein a data unit including the mobile data is obtained by turning a power on.

* * * * *